(12) United States Patent
Nissilä et al.

(10) Patent No.: US 12,368,514 B2
(45) Date of Patent: Jul. 22, 2025

(54) METHOD AND APPARATUS FOR PROVIDING A VOLTAGE

(71) Applicant: Teknologian tutkimuskeskus VTT Oy, Espoo (FI)

(72) Inventors: Jaani Nissilä, Espoo (FI); Antti Kemppinen, Espoo (FI)

(73) Assignee: Teknologian tutkimuskekus VTT Oy, Espoo (FI)

( * ) Notice: Subject to any disclaimer, the term of this patent is extended or adjusted under 35 U.S.C. 154(b) by 290 days.

(21) Appl. No.: 18/001,911

(22) PCT Filed: Jun. 16, 2021

(86) PCT No.: PCT/FI2021/050455
§ 371 (c)(1),
(2) Date: Dec. 15, 2022

(87) PCT Pub. No.: WO2021/255343
PCT Pub. Date: Dec. 23, 2021

(65) Prior Publication Data
US 2023/0239054 A1 Jul. 27, 2023

(30) Foreign Application Priority Data
Jun. 16, 2020 (FI) .................................. 20205636

(51) Int. Cl.
*H04B 10/508* (2013.01)
*G06N 10/40* (2022.01)
(Continued)

(52) U.S. Cl.
CPC .......... *H04B 10/508* (2013.01); *G06N 10/40* (2022.01); *H03K 4/00* (2013.01); *H10N 69/00* (2023.02)

(58) Field of Classification Search
CPC .......... G06N 10/40; H03K 4/00; H10N 69/00; H04B 10/508
See application file for complete search history.

(56) References Cited

U.S. PATENT DOCUMENTS 6,219,172 B1 * 4/2001 Yariv .................. H04B 10/505
359/264
6,483,100 B1 * 11/2002 Williams ................ G02F 1/015
250/552
(Continued)

OTHER PUBLICATIONS

Bardalen et al., "Packaging and Demonstration of Optical-Fiber-Coupled Photodiode Array for Operation at 4 K", IEEE Transactions on Components, Packaging and Manufacturing Technology, vol. 7, No. 9, pp. 1395-1401, XP011659771, ISSN: 2156-3950, DOI: 10.1109/TCPMT.2017.2699485, Sep. 1, 2017, 7 pages.
(Continued)

*Primary Examiner* — Tanya T Motsinger
(74) *Attorney, Agent, or Firm* — ZIEGLER IP LAW GROUP, LLC.

(57) ABSTRACT

A method for generating a voltage waveform includes
providing an optical signal, which comprises one or more sequences of optical pulses,
distributing the optical pulses via optical waveguides to a plurality of optical-to-electrical converter units,
using the optical-to-electrical converter units to convert the optical pulses into electric driving current pulses,
generating voltage pulses by driving Josephson junctions with the electric driving current pulses.

23 Claims, 10 Drawing Sheets

(51) Int. Cl.
  *H03K 4/00* (2006.01)
  *H10N 69/00* (2023.01)

(56) References Cited

U.S. PATENT DOCUMENTS

| | | | | |
|---|---|---|---|---|
| 10,797,684 | B1* | 10/2020 | Benz | H03K 3/38 |
| 2002/0003641 | A1* | 1/2002 | Hall | H04J 14/06 |
| | | | | 398/65 |
| 2003/0108280 | A1* | 6/2003 | Puzey | H04B 10/508 |
| | | | | 385/24 |
| 2007/0286603 | A1* | 12/2007 | Minato | H04J 14/08 |
| | | | | 398/53 |
| 2009/0190933 | A1* | 7/2009 | Fichter | H04B 10/2513 |
| | | | | 398/159 |
| 2009/0245801 | A1* | 10/2009 | Little | G02B 6/12007 |
| | | | | 398/89 |
| 2010/0054743 | A1* | 3/2010 | Heaton | H03M 1/121 |
| | | | | 398/91 |
| 2010/0142573 | A1* | 6/2010 | Minden | H01S 3/2383 |
| | | | | 372/29.016 |
| 2011/0147621 | A1* | 6/2011 | Ohtake | G02F 1/39 |
| | | | | 250/504 R |
| 2012/0243824 | A1* | 9/2012 | Takabayashi | H10F 77/1248 |
| | | | | 385/14 |
| 2016/0043810 | A1* | 2/2016 | Quinlan | H04B 10/90 |
| | | | | 398/208 |
| 2017/0108358 | A1* | 4/2017 | Bastianini | G01D 5/35303 |
| 2018/0165248 | A1* | 6/2018 | Valley | G06E 1/00 |
| 2019/0190707 | A1* | 6/2019 | Tomita | G02F 1/035 |
| 2019/0245685 | A1* | 8/2019 | Yoshino | H04J 7/00 |
| 2021/0006209 | A1* | 1/2021 | Oka | H03F 1/26 |
| 2021/0320726 | A1* | 10/2021 | Kalman | H04B 10/803 |
| 2023/0239054 | A1* | 7/2023 | Nissilä | G06N 10/40 |
| | | | | 398/182 |
| 2023/0400631 | A1* | 12/2023 | Zhang | G02B 6/12004 |
| 2024/0289672 | A1* | 8/2024 | Lähteenmäki | G06N 10/40 |

OTHER PUBLICATIONS

Finnish Patent and Registration Office, Office Action, Application No. 20205636, Mailed Feb. 12, 2021, 10 pages.
Gran et al, "An Optically-Powered Current Source Operating Under Cryogenic Conditions", 2012, 2 pages.
International Search Report, Application No. PCT/FI2021/050455, Mailed Nov. 16, 2021, 7 pages.
Invitation to Pay Additional Fees, and Where Applicable, Protest Fee, Application No. PCT/FI2021/050455, 14 pages.
Ireland et al, "An Optoelectronic Pulse Drive for Quantum Voltage Synthesizer", IEEE Transactions on Instrumentation and Measurement, vol. 65, No. 6, DOI: 10.1109/TIM.2018.2877562, 6 pages.
Kieler et al, "Optical Pulse-Drive for the Pulse-Driven AC Josephson Voltage Standard", IEEE Transactions on Applied Superconductivity, vol. 29, No. 5, XP011716622, ISSN: 1051-8223, DOI: 10.1109/TASC.2019.2899851, Aug. 1, 2019, 5 pages.
Kohlmann et al, "Development of Josephson junction series arrays for synthesis of AC voltages and arbitrary waveforms", J. Phys: Conf, 2006, 5 pages.
Nissila et al, "Driving a Josephson junction array with a mode-locked laser and a photodiode,", 2018, 2 pages.
Urano et al., "Generation of constant voltage steps by a Josephson array driven by optoelectronically generated pulses", Physica C, vol. 463, pp. 1123-1126, XP029159931, ISSN: 0921-4534, DOI: 10.1016/J.PHYSC.2007.01.006, 4 pages.
Urano et al., "Operation of a Josephson arbitrary waveform synthesizer with optical data input", Superconductor Science and Technology, DOI: 10.1088/0953-2048/22/11/114012, 2009, 4 pages.
Arita, Y et al. "Integration of Optical Waveguides with Single Flux Quantum Circuits", IEEE Transactions on Applied Superconductivity Jan. 6, 2011, vol. 21, No. 3, 4 pages.
Finnish Patent and Registration Office, Second opinion on patentability, Application No. 20205636, mailed Mar. 20, 2025, 13 pages.

* cited by examiner

METHOD AND APPARATUS FOR PROVIDING A VOLTAGE

FIELD

The aspects of the disclosed embodiments relates to providing a voltage waveform.

BACKGROUND

A quantized arbitrary voltage waveform may be produced by using a conventional Josephson arbitrary waveform synthesizer (JAWS). The conventional Josephson arbitrary waveform synthesizer is driven with an electric pulse pattern obtained from an electric pattern generator. The generated voltage level may be accurately determined based on the known repetition rate of the electrical pulses. The repetition rate of the electrical pulses may be traceable to the frequency of an atomic clock.

SUMMARY

The aspects of the disclosed embodiments are directed to providing a method for generating a voltage waveform. An aspect of the disclosed embodiments is to provide an apparatus for generating a voltage waveform. An aspect of the disclosed embodiments is to provide a voltage source apparatus. An aspect of the disclosed embodiments is to provide a reference voltage.

According to an aspect, there is provided a method for generating a voltage waveform ($V_{S1}(t)$, $V_{F1}(t)$), the method comprising:
  providing an optical signal (CLB1), which comprises one or more sequences of optical pulses (OPAT1,OPAT2),
  distributing the optical pulses (OPAT1) via optical waveguides (CWG1, CWG2) to a plurality of optical-to-electrical converter units (OEU1, OEU2),
  using the optical-to-electrical converter units (OEU1, OEU2) to convert the optical pulses (OPAT1,OPAT2) into electric driving current pulses (EPAT1),
  generating voltage pulses ($V_1(t)$,$V_2(t)$) by driving Josephson junctions (JJ1) with the electric driving current pulses (EPAT1).

The scope of protection sought for various embodiments of the present disclosure is set out by the independent claims. The embodiments, if any, described in this specification that do not fall under the scope of the independent claims are to be interpreted as examples useful for understanding various embodiments of the present disclosure.

The voltage source apparatus may comprise an optical pulse generator to provide optical pulses, an optical feedthrough to guide the optical pulses into a cryogenic chamber, and one or more optical distributors to distribute the optical pulses to several optical-to-electrical converters via optical waveguides. The optical-to-electrical converters may convert the optical pulses into driving current pulses. The driving current pulses may be transmitted via short electrical transmission lines a plurality of Josephson junctions. A Josephson junction may convert the driving current pulses into voltage pulses such that the integral of each individual voltage pulse is quantized, wherein said integral is determined over time. A plurality of Josephson junctions may be connected in series in order to increase magnitude of the combined voltage pulses.

The method may comprise forming a combined voltage signal by combining voltage pulses of several Josephson junctions. Combining the voltage pulses of several Josephson junctions may e.g. provide an increased voltage level and/or may provide an increased pulse repetition rate for the pulses of the combined voltage signal.

The combined voltage pulses may be optionally low-pass filtered e.g. in order to provide a highly accurate ripple-free voltage level. In an embodiment, the filtered output voltage may be kept constant. The generated voltage pulses may be low-pass filtered in order to provide an accurate reference voltage level.

The voltage source apparatus may provide a selectable and/or an arbitrary voltage waveform. The apparatus may operate as an optically driven ultrafast cryogenic arbitrary waveform source.

The apparatus may be arranged to provide a selectable voltage waveform. The apparatus may be arranged to provide a user-selectable voltage waveform. The apparatus may be arranged to provide an arbitrary voltage waveform.

Distributing the optical pulses to several optical-to-electrical converters may allow selecting the locations of the optical-to-electrical converters such that the length of transmission lines may be reduced or minimized. Performing the conversion of optical pulses into driving pulses in the spatially distributed manner may allow driving a high number of Josephson junctions and/or may substantially avoid bandwidth limitations of the electric transmission lines.

The apparatus may comprise a combination of superconducting, optical, and optoelectronic elements. Optically integrated distributed delivery of ultrafast pulses to Josephson junctions may enable a fundamentally ideal electric signal generator, which may provide nearly ideal performance. The output voltage level may be highly accurate.

The output voltage level may be accurately determined based on realization of the voltage standard as defined in the International System of Units (SI). The output voltage level may be accurately determined from the pulse repetition rate of optical pulses. In an embodiment the pulse repetition rate of optical pulses may be traceable to the frequency of an atomic clock.

The apparatus may provide any waveform in a wide bandwidth from 0 Hz to tens of gigahertz. Optical signal delivery to a cryogenic temperature may yield excellent energy efficiency since it avoids the heat conductance of high-frequency electric cables, which is a fundamental problem described by the Wiedemann-Franz law. In an embodiment, up to 500 independent voltage outputs may be implemented already in the simplest setup with a single chip and single optical fiber. This is in strong contrast to state-of-the art cryogenic signal delivery where a high number of electric coaxial cables may be needed to deliver electric signals into a cryogenic chamber.

In an embodiment, signal generation can be conveniently controlled with room temperature equipment, i.e., it is not necessary to use computing logic at cryogenic temperature.

In an embodiment, the apparatus may be arranged to provide A large number of signal outputs may be used e.g. for controlling a quantum computer.

Bandwidth up to 10 GHz and above may be required in typical quantum electronics applications where the quantum mechanical energy level spacing corresponds to the energy of microwave photons.

A large maximum output voltage may also be used e.g. for room temperature metrological applications.

In an embodiment, the waveguides and the optical-to-electrical converters may be implemented on the same substrate. The voltage source apparatus may operate as an optically integrated quantized arbitrary voltage waveform source.

The produced voltage level is based on a macroscopic quantum phenomenon, which allows determining the produced voltage from the repetition rate of generated optical pulses. The repetition rate of the optical pulses may, in turn, be traceable e.g. to an atomic clock. The produced voltage level may be traceable to international standards. In an embodiment, the voltage level produced by the apparatus may be used as a standard of voltage.

The apparatus may comprise a plurality of optical waveguides to distribute one or more optical pulse patterns to a plurality of optical-to-electrical converters. The optical-to-electrical converters of the apparatus may convert the optical pulses into electrical driving current pulses. The apparatus may comprise a plurality of Josephson junctions to provide quantized voltage pulses when the Josephson junctions are driven with the electrical driving current pulses. In other words, a Josephson junction may convert electrical driving current pulses into quantized voltage pulses. The quantized voltage pulses obtained from the Josephson junctions may be combined and optionally filtered to provide an electric waveform at a cryogenic temperature. A desired arbitrary electric waveform may be provided be selecting the one or more optical pulse patterns.

Guiding the optical pulse sequence via one or more optical waveguides may allow reaching a high pulse repetition rate for the combined voltage signal and/or may reduce losses and dispersion caused by transmitting electrical signals at high frequency via electrical transmission lines.

In an embodiment first voltage pulses obtained from one or more first Josephson junctions and second voltage pulses obtained from one or more second Josephson junctions may be combined to form both positive and negative pulses. For example, the positive and negative pulses may be filtered to provide a substantially sinusoidal waveform. For example a first optical-to-electrical converter unit may be arranged to provide driving current pulses which have a first polarity, for driving the one or more first Josephson junctions. A first optical-to-electrical converter unit may be arranged to provide driving current pulses which have a second opposite polarity, for driving the one or more second Josephson junctions.

In particular, the use of silicon photonics (SiPh) elements and optical-to-electrical converters may allow reaching higher frequencies and/or larger voltages by minimizing the role of bandwidth-limiting electrical transmission lines.

The apparatus may comprise optical-to-electrical converters to drive short chains of Josephson junctions. The short chains of Josephson junctions may be connected in series to provide higher voltages and/or to provide improved dynamic range. Small optical-to-electrical converters may be used in order to allow minimizing the lengths of electrical transmission lines.

Significant electrical losses may take place in the Josephson junctions. A plurality of Josephson junctions may be connected in series to form a chain of Josephson junctions, and the chain of Josephson junctions may be driven with current pulses obtained from an optical-to-electrical converter. The length of said chain may be short in order to reduce losses in the Josephson junctions. The total length of the chain of Josephson junctions connected to a converter may be e.g. shorter than 100 µm in order to reduce losses. The short length of the chain may also allow modeling the electrical behavior of the chain by using lumped elements.

Electrical losses may also take place in the transmission lines from a converter to the Josephson junctions. The length of the transmission line from a converter to the first (or last) Josephson junction of the chain may be e.g. shorter than 3 mm in order to reduce losses in the transmission line. In particular, the length of the transmission line from a converter to the first (or last) Josephson junction of the chain may be e.g. shorter than 100 µm.

Distributing the optical signals to a plurality of converters via optical waveguides may allow selecting the positions of the converters such that a high number of Josephson junctions may be simultaneously driven with synchronized current pulses obtained from a plurality of converters at high frequency. The number of the Josephson junctions may be e.g. greater than 100, greater than 1000, or greater than 10000, or even greater than 100000. The number of the converters may be e.g. greater than 10, greater than 100, greater than 1000, greater than 10000 or even greater than 100000. In an embodiment, the converters and the waveguides may be implemented on the same substrate.

Distributing the optical signals to a plurality of converters via optical waveguides may allow selecting the positions of the converters and the positions of the Josephson junctions such that the total circumferential length of each current loop may be e.g. shorter than 100 µm (for each converter, which contributes to the output signal). Said current loop for the driving current pulses may include a converter, a first conductive transmission line from the converter to a chain of Josephson junctions, the chain, and a second conductive transmission line from the chain to the converter. The short circumferential length of the current loop may minimize losses, may allow providing driving current pulses at high repetition rate, and/or may help to avoid disturbing reflections.

The optical-to-electrical converters may be e.g. plasmonic photodetectors, uni-traveling-carrier photodiodes (UTC-photodiodes), or superconducting nanowire single-photon detectors (SNSPD).

An optical signal comprising one or more optical pulse sequences may be guided into a cryogenic chamber via an optical feedthrough. Optical pulse sequences may be distributed to a plurality of optical-to-electrical converters e.g. by using one or more optical distributors and silicon photonic (SiPh) optical transmission lines. Optical pulse sequences received from an optical feedthrough may be distributed to a plurality of optical transmission lines e.g. by wavelength division de-multiplexing (WDM). Optical pulse sequences may be distributed to a plurality of optical transmission lines by one or more spectrally selective optical distributors inside a cryogenic chamber.

An optical signal may comprise a plurality of optical pulse sequences at different wavelengths, wherein the different pulse sequences may be demultiplexed from the optical signal into several different optical transmission lines by one or more spectrally selective optical distributors.

In an embodiment, the optical waveguides and the optical-to-electrical converters may be implemented on the same substrate. The optical-to-electrical converters may be located close to the Josephson junctions, e.g. in order to minimize lengths of the electric transmission lines and/or in order to minimize electric transmission losses and/or dispersion. The optical-to-electrical converters may be integrated directly on the waveguides and may be located close to the Josephson junctions. This may enable high integration density and performance.

The bandwidth of SiPh components and optical-to-electrical converters may be e.g. higher than 200 GHz. Consequently, an optical-to-electrical converter may be arranged to provide electrical pulses at a repetition rate, which is at least 200 GHz. One or more optical-to-electrical converters may be arranged to drive Josephson junctions with at least 200 GHz pulse frequency. One or more optical-to-electrical converters may be arranged to drive chains of Josephson junctions with at least 200 GHz pulse frequency.

One or more optical-to-electrical converters may be arranged to drive chains of Josephson junctions with a frequency, which is higher than 200 GHz.

In an embodiment, the electric waveform of optical-to-electrical converters may be filtered with a low pass filter to provide a substantially noiseless output voltage waveform. Furthermore, the instantaneous voltage level of the output voltage waveform may be accurately determined from the repetition rate of the optical pulses guided to the optical-to-electrical converters. The repetition rate of the optical pulses may be accurately known. The repetition rate of the optical pulses may be traceable to an atomic clock.

Thus, by using sigma-delta modulation and sufficient low pass filtering, a noiseless calculable voltage signal up to tens of gigahertz may be realized.

The generated electric waveform may be used e.g. for controlling a quantum computer at a cryogenic temperature. The generated electric waveform may be used e.g. for controlling qubits of a quantum computer at a cryogenic temperature.

The generated electric waveform may be used e.g. as a voltage standard for calibrating a measuring instrument. The generated electric waveform may be used e.g. as a voltage standard for verifying operation of a measuring instrument. The generated electric waveform may be used for a voltage metrology application at room temperature. The generated electric waveform may be used for a voltage metrology application at a cryogenic temperature.

The apparatus may be arranged to provide a higher voltage level and/or at a higher frequency, when compared with a typical voltage reference based on Josephson junctions.

In an embodiment, the voltage waveform obtained from the Josephson junctions may be coupled out of the cryogenic chamber and may be used for an application outside the cryogenic chamber. The voltage waveform generated at the cryogenic temperature may be coupled out of the cryogenic chamber and used at normal room temperature.

Traditional Josephson arbitrary waveform synthesizers (JAWS) are driven with electrically generated pulse patterns. Missing (0) or existing (1) current pulses occur at a frequency traceable to an atomic clock.

A Josephson junction may be driven with a sequence of electric driving pulses. The sequence may consist of a plurality of missing (0) and existing (1) current pulses. The symbol "0" may denote the logical level zero, and the symbol "1" may denote the logical level one. When a Josephson junction is driven with the electric pulses, each driving pulse 0 may result in zero voltage, and each driving pulse 1 may cause the Josephson junction to generate a voltage pulse which has a quantized time integral. The quantized voltage pulse may have either positive or negative polarity depending on direction of pulse current through it. The quantized time integral may be equal to a magnetic flux quantum multiplied by an integer. The quantized time integral is typically equal to a single magnetic flux quantum. However, the quantized time integral may also be equal to multiple flux quanta.

In an embodiment, an optical pulse pattern generator of the apparatus may also be arranged to provide multi-level optical pulses, i.e. the amplitude of an optical pulse of a pulse pattern may also be different from the zero amplitude and different from the full amplitude. Selecting the amplitude of the optical pulses may allow selecting the Shapiro step index for generating voltage pulses of multiple flux quanta.

A quantized arbitrary voltage waveform may be generated by providing an optical pulse pattern, converting the optical pulse pattern into electric driving pulses by using an optical-to-electrical converter, generating quantized voltage pulses by driving a Josephson junction with the driving pulses. A filtered output waveform may be formed by filtering the quantized arbitrary voltage waveform with a low pass filter.

The maximum rate of change and the maximum voltage of the filtered output waveform may be limited by the repetition rate of the driving pulses.

The optical pulses may be converted into electric driving pulses by optical-to-electrical converters. The optical-to-electrical converter may be e.g. an uni-traveling-carrier photodiode (UTC-PD). The uni-traveling-carrier photodiode may utilize only electrons as the active carriers. The optical-to-electrical converter may also be e.g. a plasmonic photodetector or a superconducting nanowire single-photon detectors (SNSPD). The optical-to-electrical converter may be e.g. a superconducting nanowire detector, which may be arranged to detect single and/or multiple photons. The superconducting nanowire detector may be a superconducting nanowire single-photon detector or a structurally modified superconducting nanowire single-photon detector. The structurally modified superconducting nanowire single-photon detector may have suitable detection efficiency for detecting multiple photons.

The superconducting nanowire detector may be a (SNPD) may be a variant of the commonly known superconducting nanowire single-photon detector (SNSPD) with the difference that SNPD does not need to be a reliable detector of single photons. For example, the probability to detect a single photon may be e.g. between 1% and 100%. SNPD can be used to detect optical pulses of e.g. 1, 10, 100, or 1000 photons. Relaxing the criterion for the probability of detecting a single photon may improve device yield and help increasing the device bandwidth. UTC photodiodes and plasmonic photodetectors may allow a high bandwidth even above 1 THz. SNPD may allow a good energy efficiency when it detects optical pulses with e.g. less than 1000 photons. All optical-to-electrical converters may allow reducing the heat flow into the cryogenic temperature since the high-frequency signals may be carried by non-metallic optical waveguides.

As a comparative example, a single UTC photodiode may be arranged to drive all Josephson junctions of an entire Josephson arbitrary waveform synthesizer chip. Electrical driving pulses may be transmitted to long arrays of Josephson junctions via an electrical transmission line. In this comparative example, losses and/or dispersion in the electrical transmission line may increase with increasing frequency and with increasing number of junctions. The increasing losses and/or dispersion in the electrical transmission line may limit both the pulse drive frequency and the number of junctions driven by the transmission line. The transmission line may limit the bandwidth of generating the arbitrary voltage waveform.

The maximum output voltage may be proportional to the drive frequency and to the number of junctions. Even though electrical power division (e.g. a Wilkinson power divider) can be used to divide the junction array in a few separate transmission lines, transmission line losses may make it difficult to drive a high number of junctions with a single electric driving signal. Thus, the transmission line losses may make it difficult to achieve voltage signals that are sufficiently high for especially room temperature applications. Generating voltage pulses of multiple flux quanta (Shapiro step indices 2, 3, . . . ) may multiply also the output voltage, but the higher the Shapiro step index, the more accurate current pulses are needed and therefore the less transmission line attenuation is accepted. There may be a trade-off between drive frequency, number of Josephson junctions in the array, and the Shapiro step index. The trade-off means that a single parameter can be increased at the expense of decreasing others. The trade-off causes that it is typically difficult to increase the output voltage when distributing a single electric driving signal to a high number of Josephson junctions.

Using the distributed optical-to-electrical conversion together with optimized electrical transmission lines may allow providing increased output voltage and/or may increase bandwidth of the output voltage waveform.

In an embodiment, waveguides implemented by silicon photonics (SiPh) may allow transmitting and dividing ultra-fast optical pulse signals on chip with low losses even at high frequencies. Optical-to-electrical converters may be integrated directly to the optical transmission line in order to generate electrical driving current pulses. Silicon photonics and optical-to-electrical converters with small footprint may allow distributed optical-to-electrical conversion and high density of components so that the total number of Josephson junctions can be large, wherein the maximum length of transmission lines may be short.

Ultimately, the arrays of Josephson junctions may even be so short that they can be considered as lumped elements. A first group of Josephson junctions of a first branch may be connected in series with a second group of Josephson junctions of a second branch. Josephson junctions in different branches may be connected in series e.g. with inductive elements.

Connecting the Josephson junctions of the different branches in series with an inductive element may substantially prevent cross-talk at the high frequency of the driving pulses, but may allow summing the output voltages of the branches in the bandwidth of arbitrary output voltage waveform.

In an embodiment, using the distributed optical-to-electrical conversion may simultaneously allow high drive frequency, a large number of junctions on a single chip, and higher Shapiro step index.

The optical-to-electrical converter may be e.g. a plasmonic photodetector. The plasmonic photodetector may be easily combined in an optical waveguide. In particular, the plasmonic photodetector may be easily integrated with a silicon photonic (SiPh) transmission line.

The optical-to-electrical converter may also be e.g. an uni-traveling-carrier photodiode (UTC).

The optical-to-electrical converter may also be a superconducting nanowire photon detector (SNPD). Typically, the response of an SNPD to an optical pulse consists of a fast rise time (e.g. some tens of ps) and a slower trailing edge (e.g. 1 ns). By biasing two such SNPDs with opposite currents such that they provide electric pulses with opposite polarities, and by properly adjusting the relative optical pulse energies and the relative delay of the optical pulse trains fed into them, it may be possible to effectively produce pulses with substantially reduced tail. This may allow using said SNPD pairs to drive Josephson junctions with larger pulse rate compared to using SNPDs alone.

The optical waveguides, the optical-to-electrical converters, the electrical transmission lines and the Josephson junctions may be implemented on the same substrate. The components may be implemented on a single chip. The single-chip version may e.g. allow minimizing the lengths of the electrical transmission lines.

Alternatively, the optical waveguides, the optical-to-electrical converters, the electrical transmission lines and the Josephson junctions may be implemented on two or more different substrates. The components may be implemented on two or more different chips. For example, optical waveguides and optical-to-electrical converters may be implemented on a first substrate, wherein the Josephson junctions may be implemented on a second substrate. The electrical driving signals from the optical-to-electrical converters of the first chip may be connected to drive the Josephson junctions of the second chip. The electrical connections between electrical transmission lines of optical-to-electrical converters and electrical transmission lines of the Josephson junctions may be formed e.g. by flip-chip connection method.

Optical high-frequency pulse signal arriving from an optical fiber may be coupled to a silicon photonic transmission line that is integrated to a silicon chip. Optical power division may be used to distribute the optical pulse pattern signal into several branches. Each branch may comprise an optical-to-electrical converter. Each optical-to-electrical converter may convert an arriving optical pulse into an electrical driving current pulse, which is used to drive Josephson junctions.

Driving Josephson junctions with the electrical pulses may result in output voltage pulses, which have a quantized time integral. Delta-sigma conversion and low-pass filtering may be used to generate an arbitrary quantized voltage waveforms from the output voltage pulses of the Josephson junctions.

SiPh waveguides and integrated optical-to-electrical converters may allow high integration density, increased pulse frequency, and/or high Shapiro step index. The increased pulse frequency and the high Shapiro step index may increase the output voltage. The increased output voltage may be useful e.g. for carrying out a metrological calibration or verification operation at the room temperature.

The increased pulse frequency may enable increasing the cut-off frequency of the low-pass filter.

Distributing optical pulses to a plurality of optical-to-electrical converters, and driving the Josephson junctions only via short transmission lines may enable cryogenic generation of high-frequency arbitrary waveforms with ultimate precision and very low noise. The quantization effect of a Josephson junction may also reduce electrical noise of the output pulses of the Josephson junction.

The capability of high frequency operation, precision and low noise may be useful qualities in many applications. In particular, the capability of high frequency operation, precision and low noise may be useful when using the output waveform for driving a quantum computer.

The apparatus may be energy efficient, which may be useful in a quantum technology application.

The apparatus may provide an increased voltage level, which may be useful also for a room temperature application.

In an embodiment, wavelength multiplexing and demultiplexing may be used to drive different branches of a Josephson junction array with different optical pulse sequences. Driving the different branches with different optical pulse sequences may be used to increase the effective frequency of delta-sigma conversion even beyond the bandwidth of the optical-to-electrical converters and Josephson junctions. In particular, the driving electrical current pulses and the resulting quantized voltage pulses can overlap in time as long as sequential pulses in the same branch do not overlap.

In an embodiment, an array of Josephson junctions may be partitioned into a plurality of groups, which may have different number of Josephson junctions. For example, a first group may have $2^{k-1}$ Josephson junctions, a second group may have $2^k$, Josephson junctions, and a group identified by an integer index k may have $2^{k-1}$ Josephson junctions. The apparatus may be arranged to drive each group of junctions with a different pulse sequences, e.g. in order to increase the freedom of choosing the output voltage magnitude In an embodiment, the operation of each optical-to-electrical converter may be independently enabled and disabled e.g. by controlling a bias voltage of said optical-to-electrical converter.

For use in a quantum technology application, one or more optical-to-electrical converters may be selectively enabled or disabled e.g. in order to improve dynamic range of the output voltage, in order to maximize accuracy and/or in order to provide maximum bandwidth of the output voltage waveform.

In an embodiment, independent groups of junctions may be driven with pulse sequences providing similar arbitrary waveforms, but shifted in time relative to each other, which may enable improving the amplitude resolution of output waveforms when groups of junctions are connected in series for the output.

For use in a room temperature application, the distributed optical-to-electrical conversion may allow synchronized driving of an increased total number of Josephson junctions. The lengths of the electrical transmission lines between the optical-to-electrical converters and the Josephson junctions may be optimized for the product of maximum pulse frequency and the number of the Josephson junctions. The electrical transmission lines between the optical-to-electrical converters and the Josephson junctions may be substantially of equal length. In an embodiment, one or more optical-to-electrical converters may be selectively enabled or disabled to allow optimization of the operating parameters.

The apparatus may be used e.g. for providing one or more voltage waveforms for a cryogenic quantum data processor. The apparatus may be used e.g. for scaling up a quantum computer.

BRIEF DESCRIPTION OF THE DRAWINGS

In the following examples, several variations will be described in more detail with reference to the appended drawings, in which.

DETAILED DESCRIPTION

Figure 1:
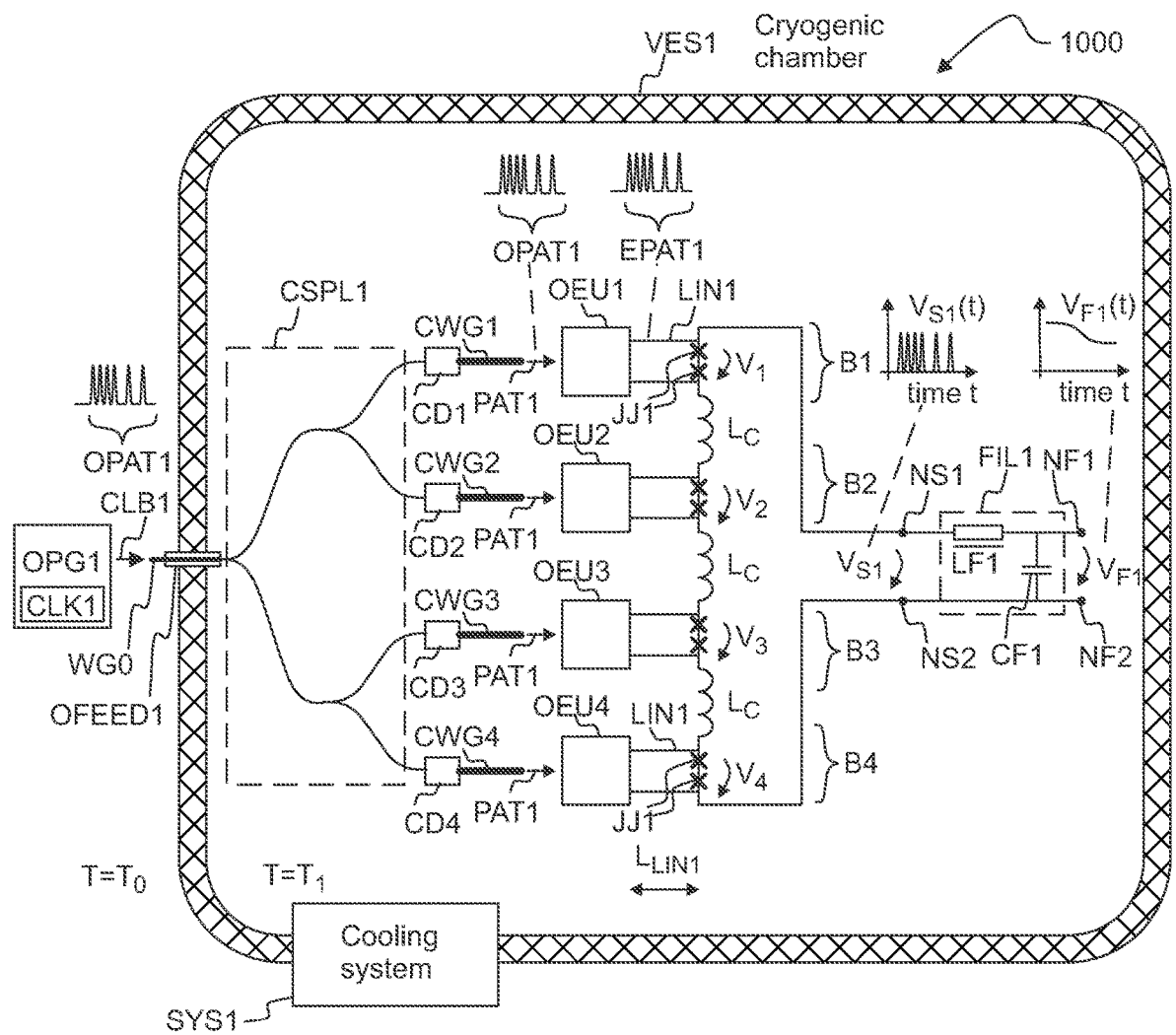
FIG. 1 shows, by way of example, a voltage source apparatus.

Referring to FIG. 1, the voltage source apparatus 1000 may comprise several branches $B_1$, $B_2$, $B_3$, $B_4$. Each branch ($B_1$) may comprise one or more waveguides (CWG1), one or more optical-to-electrical converter units (OEU1), and one or more Josephson junctions (JJ1).

The number of the branches may be e.g. greater than or equal to 2. The number of the branches may be e.g. greater than or equal to 4. The number of the branches may be e.g. in the range of 2 to $10^6$.

The apparatus 1000 may comprise an optical pattern generator OPG1 to provide an optical signal CLB1, which comprises one or more optical pulse sequences OPAT1. The optical signal CLB1 may comprise one or more sequences OPAT1 of optical pulses. One or more sequences OPAT1 of optical pulses of the optical signal CLB1 may be formed e.g. according a primary pattern (e.g. PAT0 in FIG. 5c). The sequence OPAT1 of optical pulses may also be called as an optical pulse pattern OPAT1. The optical signal CLB1 may comprise one or more pulse patterns OPAT1, OPAT2. The pulse repetition rate of the optical pulses of the optical signal CLB1 may be e.g. higher than 50 GHz.

When using plasmonic photodetectors or UTC photodiodes as the converters, the repetition rate of the optical pulses of the optical pulse sequence may be e.g. greater than 50 GHz. the repetition rate of the optical pulses may be e.g. in the range of 50 GHz to 500 GHz.

The optical pulse sequence OPAT1 may be guided to an optical-to-electrical converter unit OEU1 via a waveguide CWG1. The optical-to-electrical converter unit OEU1 may convert the optical pulse sequence OPAT1 into a sequence of electric driving current pulses EPAT1. The electric driving current pulses EPAT1 may be transmitted to one or more Josephson junctions JJ1 via transmission lines LIN1. The Josephson junctions JJ1 may be driven with the electric driving current pulses. The Josephson junctions JJ1 may generate a voltage pulse $V_1(t)$ when driven with the electric driving current pulses EPAT1.

The apparatus 1000 may comprise one or more optical distributors CSPL1 to distribute the optical pulses (OPAT1) of the optical signal CLB1 to several optical-to-electrical converter units OEU1, OEU2. The one or more distributors CSPL1 may distribute the optical pulses (OPAT1) to several waveguides CWG1, CWG2. The distributed optical pulses (OPAT1) may be guided to the several optical-to-electrical converter units OEU1, OEU2 via the waveguides CWG1, CWG2. The apparatus 1000 may comprise one or more optical distributors CSPL1 to distribute the optical pulses (OPAT1) to the different branches $B_1$, $B_2$, $B_3$, $B_4$. The one or more optical distributors CSPL1 may be located inside the cryogenic chamber VES1 so that the optical signal CLB1 may be guided into the cryogenic chamber VES1 via a single optical feedthrough. The optical pulses (OPAT1) may be distributed to the different branches $B_1$, $B_2$, $B_3$, $B_4$ inside the cryogenic chamber VES1. One or more optical distributors CSPL1 may be located inside the cryogenic chamber VES1 also in order to reduce conduction and/or radiation of heat via optical feedthroughs OFEED1. The optical distributors CSPL1 may be arranged to operate at the cryogenic operating temperature(s) ($T_1$).

The apparatus 100 may comprise e.g. more than 1000 Josephson junctions JJ1, more than 10000 Josephson junctions JJ1, or even more than 100000 Josephson junctions JJ1. Distributing the optical pulses to a plurality of optical-to-electrical converter units OEU1, OEU2 may facilitate driving a high number of Josephson junctions JJ1 with a high pulse repetition frequency.

The spatial locations of the optical-to-electrical converter units (OEC1, OEC2) may be selected e.g. such that a maximum distance (LLIN1) for transferring electric driving current pulses (EPAT1) from each optical-to-electrical converter unit (OEC1, OEC2) to a Josephson junction (JJ1) is smaller than 3 mm. The short electrical transmission lines (LIN1) may allow increased pulse repetition rates and/or may reduce losses and/or dispersion.

The electric driving current pulses (EPAT1) may be transmitted from the optical-to-electrical converter units (OEC1, OEC2) to the Josephson junctions (JJ1) via electrical transmission lines (LIN1), wherein the lengths ($L_{LIN1}$) of the electrical transmission lines (LIN1) may be substantially equal. For example, the deviation of the length of each electrical transmission line (LIN1) from a nominal length ($L_0$) may be smaller than e.g. 3 mm. The substantially equal lengths of the electrical transmission lines (LIN1) may facilitate synchronization of operation of the Josephson junctions (JJ1) connected to the different optical-to-electrical converter units (OEC1, OEC2). The 3 mm different of length may approximately correspond to a time delay of 1 ns for signals, which propagate at the speed of light.

The driving current pulses provided by a converter may propagate from the converter via a current loop to the Josephson junctions and back to the converter. In an embodiment, the spatial locations of the optical-to-electrical converter units (OEC1, OEC2) may be selected such that the circumferential length of the current loop of a converter via the Josephson junctions back to the converter is shorter than e.g. 100 μm.

The optical signal CLB1 may be guided to an optical-to-electrical converter OEC1 via an optical waveguide WG0. The optical signal may be distributed to several optical-to-electrical converters OEC1, OEC2 by several waveguides CWG1, CWG2. In an embodiment several optical waveguides CWG1, CWG2 and several optical-to-electrical converters OEC1, OEC2 may be implemented on the same substrate SUB1 (FIG. 7b).

The apparatus 1000 may optionally comprise one or more delay lines CD1, CD2, CD3, CD4 to synchronize and/or modify the arrival times of the optical pulses arriving at the different optical-to-electrical converter units OEU1, OEU2.

The one or more Josephson junctions JJ1 of each branch may generate quantized voltage pulses. Several Josephson junctions JJ1 may be connected in series to provide an increased voltage.

One or more Josephson junctions JJ1 of the first branch $B_1$ may generate voltage pulses $V_1(t)$ when driven with the driving current pulses EPAT1 obtained from the optical-to-electrical converter unit OEU1 of the first branch $B_1$.

One or more Josephson junctions JJ1 of the second branch $B_2$ may generate voltage pulses $V_2(t)$ when driven with the driving current pulses EPAT1 obtained from the optical-to-electrical converter unit OEU2 of the second branch $B_2$.

One or more Josephson junctions JJ1 of the third branch $B_3$ may generate voltage pulses $V_3(t)$ when driven with the driving current pulses EPAT1 obtained from the optical-to-electrical converter unit OEU3 of the third branch $B_3$.

One or more Josephson junctions JJ1 of the fourth branch $B_4$ may generate voltage pulses $V_4(t)$ when driven with the driving current pulses EPAT1 obtained from the optical-to-electrical converter unit OEU4 of the fourth branch $B_4$.

The voltage pulses ($V_1(t)$, $V_2(t)$ of two or more branches may be combined to form a combined voltage signal $V_{S1}(t)$. The apparatus may comprise output nodes NS1, NS2 to provide a combined signal. The voltage pulses ($V_1(t)$, $V_2(t)$ of two or more branches may be combined to provide an increased voltage level. For example, the Josephson junctions JJ1 of the first branch $B_1$ may be connected in series with the Josephson junctions JJ1 of the first branch $B_2$. The junctions JJ1 of the first branch $B_1$ may be connected in series with the junctions JJ1 of the second branch $B_2$ e.g. by using one or more inductive components $L_C$. The combined signal $V_{S1}(t)$ may be optionally filtered with a low pass filter FIL1 to provide a filtered output signal $V_{F1}(t)$. The apparatus may comprise output nodes NF1, NF2 to provide a filtered signal. The low pass filter FIL1 may be implemented e.g. by one or more inductive elements $L_{F1}$ and by one or more capacitive elements $C_{F1}$.

The time integral of each voltage pulse $V_1(t)$ of a Josephson junction JJ1 may be quantized according to the well-known quantum mechanical Josephson effects. The time integral of each voltage pulse $V_1(t)$ of a Josephson junction JJ1 may be exactly equal to an integer times the magnetic flux quantum h/(2e) where h is the Planck constant and e is the elementary charge. When the Josephson junction is driven with current pulses with a known repetition frequency f, the average voltage over the junction is equal to h/(2e) multiplied by the repetition frequency multiplied by an integer.

Consequently, the average value of the voltage pulses ($V_1(t)$) of a Josephson junction JJ1 may be accurately determined from the repetition rate of the driving current pulses EPAT1. The repetition rate of the driving current pulses EPAT1 may be equal to the repetition rate of the optical pulses OPAT1.

The repetition rate of the optical pulses OPAT1 may be controlled or measured by a using clock CLK1. The repetition rate of the optical pulses OPAT1 may be accurately known and the repetition rate of the optical pulses OPAT1 may be traceable to an international standard of frequency.

The voltage level of the filtered output signal $V_{F1}(t)$ may be accurately determined from the quantized time integrals of the voltage pulses ($V_1(t)$, $V_2(t)$, $V_3(t)$, $V_4(t)$). The voltage level of the filtered output signal $V_{F1}(t)$ may be accurately determined from the repetition rate of the optical pulses guided to the different branches of the apparatus 1000. The voltage level of the filtered output signal $V_{F1}(t)$ may be traceable to the frequency of an atomic clock. The atomic clock may be e.g. a Caesium atomic clock.

In an embodiment, the filtered output signal $V_{F1}(t)$ may be used as a highly accurate voltage standard. The method may comprise determining the voltage level of the filtered output signal $V_{F1}(t)$ from the repetition rate(s) of the optical pulses of the optical signal CLB1.

The optical-to-electrical converter units (OEU1) and the Josephson junctions (JJ1) may be arranged to operate at cryogenic temperatures ($T_1$). The operating temperatures of the optical-to-electrical converter units (OEU1) and the Josephson junctions (JJ1) may be e.g. lower than 20 K, lower than 5 K, or even lower than 1 K.

The optical-to-electrical converter units (OEU1) and the Josephson junctions (JJ1) may be arranged to operate inside a cryogenic chamber VES1. The apparatus 1000 may comprise the cryogenic chamber VES1. The apparatus 1000 may comprise a cooling system SYS1 to provide the cryogenic operating temperatures ($T_1$) for the optical-to-electrical converter units (OEU1) and the Josephson junctions (JJ1). $T_0$ may denote an ambient temperature.

The cryogenic temperature $T_1$ may be e.g. lower than 5 K. For example, the upper temperature of liquid helium is 4.2 K, and cryogenic temperatures $T_1$ lower than 5 K may be attained by using a cooling system SYS1, which utilizes liquid helium. For more demanding applications, the cooling system SYS1 may be arranged to keep the cryogenic temperature $T_1$ e.g. lower than 1 K. The difference between the ambient temperature $T_0$ and the internal cryogenic temperature $T_1$ may be e.g. greater than 100 K. The ambient temperature $T_0$ may be e.g. substantially equal to the normal room temperature 25° C. (298 K).

The system 1000 may comprise one or more optical feedthroughs OFEED1 for guiding optical signals CLB1 into the cryogenic chamber VES1.

For example, the optical signal CLB1 may be guided into the cryogenic chamber VES1 via a single optical feedthrough OFEED1 and via a single optical waveguide WG0.

Using the optical feedthrough OFEED1 may facilitate maintaining the cryogenic temperature of the vessel VES1. Using the optical feedthrough OFEED1 for guiding the optical signal into the cryogenic chamber VES1 may substantially reduce thermal power conducted via the feedthrough OFEED1 into the cryogenic vessel VES1, when compared with a situation where an electric signal with the same rate of pulses would be guided into the vessel via an electric feedthrough.

Figure 2:
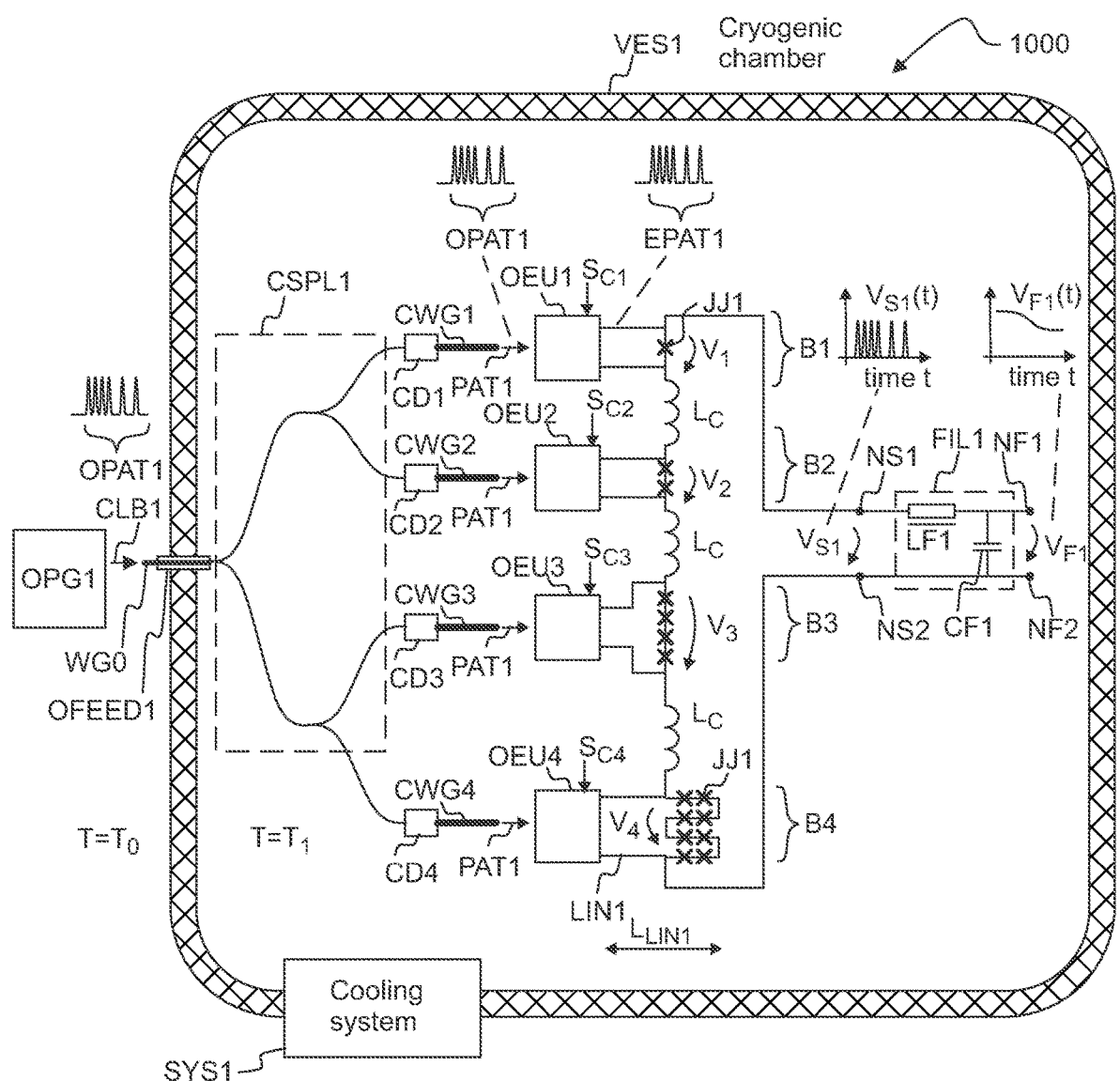
FIG. 2 shows, by way of example, a voltage source apparatus.

Referring to FIG. 2, a plurality of Josephson junctions JJ1 may be partitioned into two or more groups such that the number of first Josephson junctions JJ1 of a first group is different from the number of second Josephson junctions JJ1 of a second group. The first Josephson junctions JJ1 of the first group may be connected in series with the second Josephson junctions JJ1 of the second group. The operation of the Josephson junctions JJ1 of the different groups may be independently enabled and disabled by one or more control signals. The independent control of the different groups may improve dynamic range of the produced voltage. The independent control of the different groups may allow selecting an optimum subset of active branches ($B_1$, $B_2$, $B_3$, $B_4$) for producing a desired voltage level and/or producing a desired voltage waveform.

For example, the operation of a first optical-to-electrical converter unit OEU1 of the first branch B1 may be enabled and disabled may communicating a control signal $S_{C1}$ to the first optical-to-electrical converter unit OEU1. For example, a first control signal Sc, may be arranged to enable and disable operation of a bias unit (BIAS1) of a first optical-to-electrical converter unit OEC1. Enabling the operation of the first optical-to-electrical converter unit OEU1 may enable operation of the Josephson junctions JJ1 of the first branch disabling the operation of the first optical-to-electrical converter unit OEU1 may disable operation of the Josephson junctions JJ1 of the first branch respectively.

In a similar fashion, the operation of the Josephson junctions JJ1 of the other branches $B_2$, $B_3$, $B_4$ may be enabled and disabled by control signals $S_{C2}$, $S_{C3}$, $S_{C4}$.

The one or more control signals $S_{C1}$, $S_{C2}$ may allow selecting the active optical-to-electrical converters, which are enabled to convert optical pulses into electrical driving current pulses. The one or more control signals may allow selecting the disabled optical-to-electrical converters, respectively. A first control signal may be arranged to enable and disable operation of a first group optical-to-electrical converters, and a second control signal may be arranged to enable and disable operation of a second group optical-to-electrical converters.

A first control signal $S_{C1}$ may allow enabling and disabling operation of the Josephson junctions JJ1 of a first branch B1 of the apparatus 1000, by controlling operation of the one or more optical-to-electrical converters OEC1 of the first branch B1. A second control signal $S_{C2}$ may allow enabling and disabling operation of the Josephson junctions JJ1 of a second branch B2 of the apparatus 1000, by controlling operation of the one or more optical-to-electrical converters OEC2 of the second branch B2. The Josephson junctions JJ1 of a first branch B1 of the apparatus 1000 may be connected in series with the Josephson junctions JJ1 of a second branch B2 of the apparatus 1000, e.g. to improve signal dynamic range.

In an embodiment, a plurality of Josephson junctions JJ1 may be partitioned into two or more groups such that the number of first Josephson junctions JJ1 of a first group is different from the number of second Josephson junctions JJ1 of a second group.

For example, a group may comprise only one Josephson junction JJ1. For example, a first group may consist of two Josephson junctions JJ1. For example, a second group may consist of four Josephson junctions JJ1.

In an embodiment, an array of Josephson junctions may be partitioned into a plurality of groups, which may have different number of Josephson junctions. For example, a first group may have $2^1$ Josephson junctions, a second group may have $2^2$ Josephson junctions, and a group indicated by an integer index k may have $2^k$ Josephson junctions.

In an embodiment, the operation of each group of Josephson junctions may be independently enabled and disabled, e.g. in order to increase the freedom of choosing the output voltage magnitude.

The Josephson junctions JJ1 may be partitioned into two or more groups, a first group comprises first Josephson junctions JJ1 connected in series, a second group comprises second Josephson junctions JJ1 connected in series, the first Josephson junctions JJ1 are connected in series with the second Josephson junctions JJ1, the number of Josephson junctions JJ1 of the first group is different from the number of Josephson junctions JJ1 of the second group, and wherein the method comprises enabling and disabling operation of the Josephson junctions JJ1 of the first group in a situation where operation of the Josephson junctions JJ1 of the second group are enabled.

In an embodiment, the apparatus 1000 may be arranged to drive each group of junctions with a different pulse sequences, e.g. in order to increase the freedom of choosing the output voltage magnitude.

Figure 3:
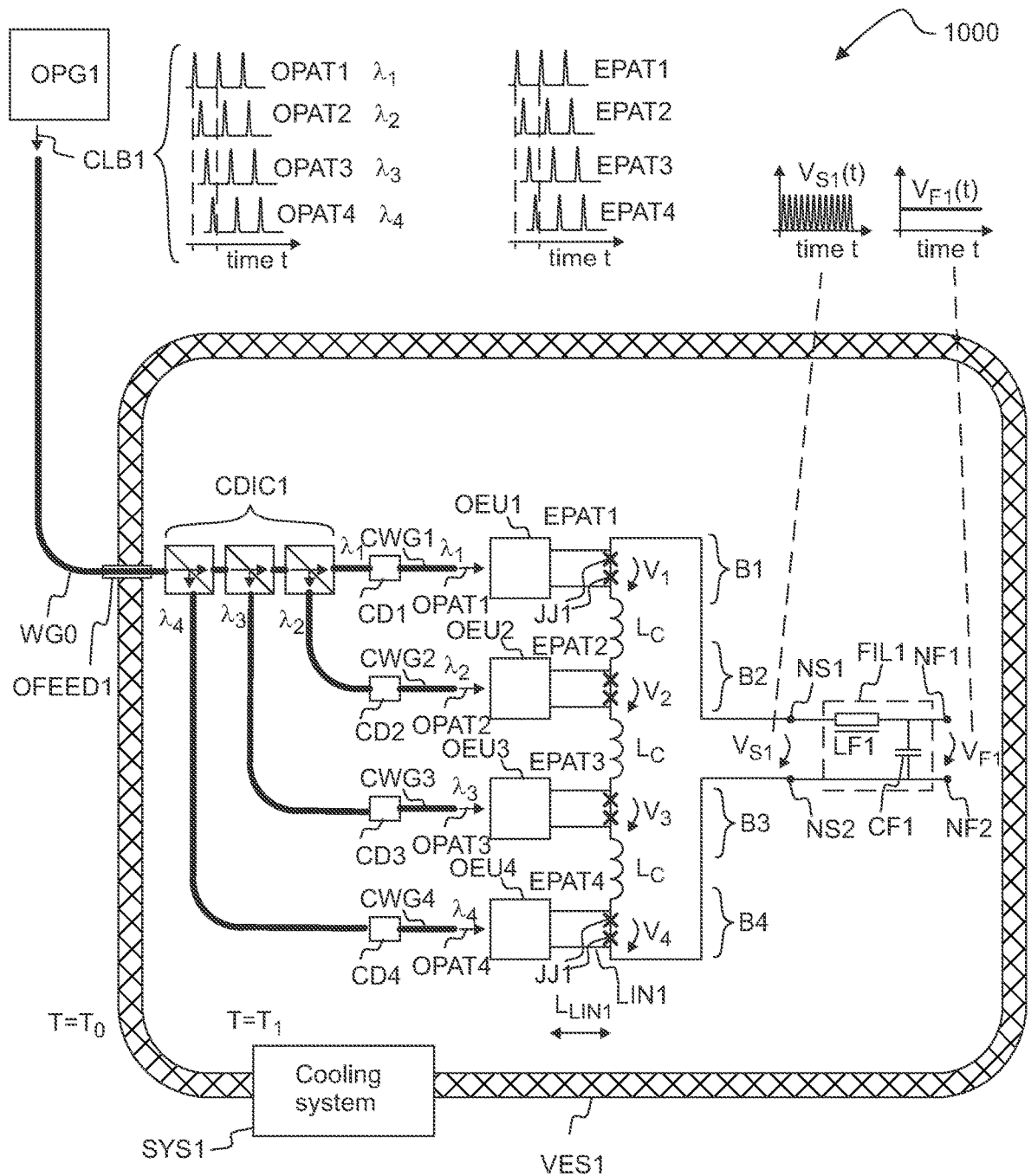
FIG. 3 shows, by way of example, a voltage source apparatus.

Referring to FIG. 3, the optical signal CLB1 may comprise two or more sequences of optical pulses OPAT1, OPAT2 at different wavelengths $\lambda_1$, $\lambda_2$. The optical pulses OPAT1, OPAT2 may be guided to one or more spectrally selective distributors CDIC1 via a single waveguide WG0. The one or more spectrally selective distributors CDIC1 may distribute the optical pulses in a spectrally selective manner to different optical-to-electrical converter units OEU1, OEU2.

The optical signal CLB1 may comprises a first sequence of optical pulses OPAT1 at a first wavelength $\lambda_1$, and a second sequence of optical pulses OPAT2 at a second different wavelength $\lambda_2$. The method may comprise spectrally separating the first sequence of optical pulses OPAT1 from the optical signal CLB1 and guiding the separated first sequence of optical pulses OPAT1 to one or more first optical-to-electrical converter units OEU1, wherein the method may comprise guiding the second sequence of optical pulses OPAT2 to one or more second optical-to-electrical converter units OEU2.

Spectrally separating the optical pulses of different wavelengths $\lambda_1$, $\lambda_2$ to different branches $B_1$, $B_2$ may allow independent control of the different branches $B_1$, $B_2$.

Spectrally separating the optical pulses of different wavelengths $\lambda_1$, $\lambda_2$ to different branches $B_1$, $B_2$ may provide improved dynamic range.

Spectrally separating the optical pulses of different wavelengths $\lambda_1$, $\lambda_2$ to different branches $B_1$, $B_2$ may allow selecting an optimum subset of the branches $B_1$, $B_2$ for generating a desired voltage waveform.

In an embodiment, the arrival times of the optical pulses at the different optical-to-electrical converter units OEU1, OEU2 may be interlaced so as to increase the pulse repetition rate of the combined voltage signal $V_{S1}(t)$.

The interlaced arrival times of the optical pulses may also allow increasing the cut-off frequency of the low pass filter FIL1, for an application where the combined voltage signal $V_{S1}(t)$ is filtered with the low pass filter FIL1.

Figure 4A:
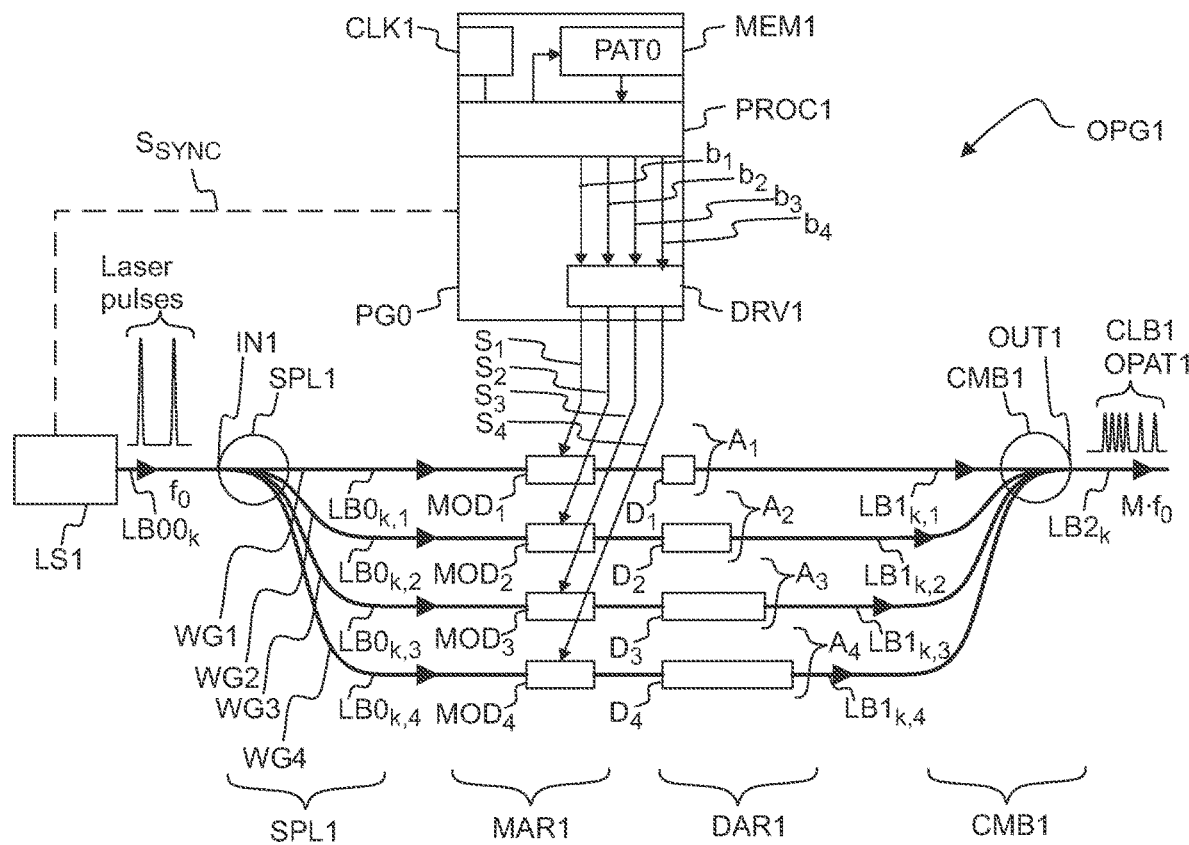
FIG. 4a shows, by way of example, an optical pattern generator device.
Figure 4B:
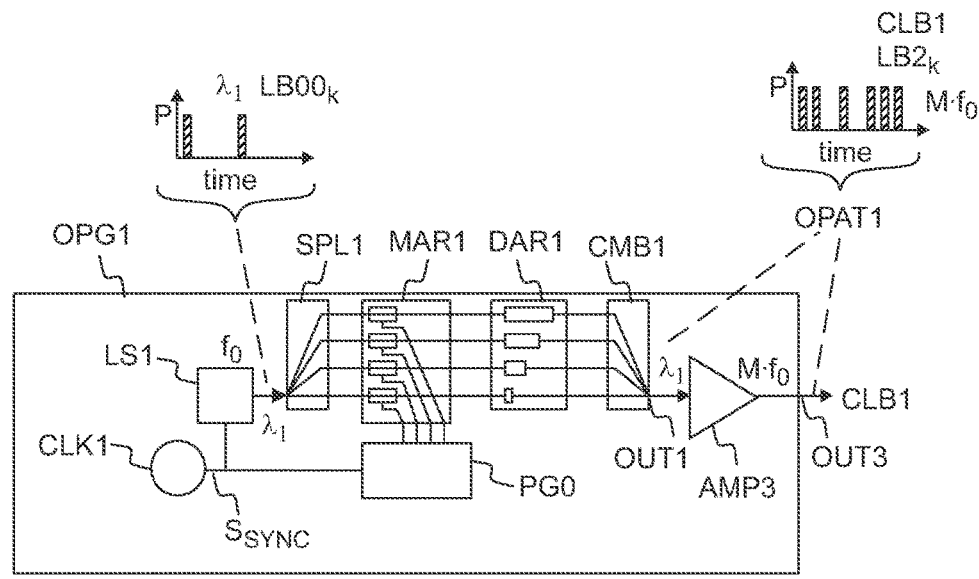
FIG. 4b shows, by way of example, an optical pattern generator device.

Referring to FIGS. 4a and 4b, the optical pattern generator device so OPG1 may generate an optical pulse pattern OPAT1 e.g. by a method, which comprises:

distributing a primary pulse (LB00) into several secondary pulses (LB0),
guiding the secondary pulses (LB0) to propagate along different optical branches ($A_1$, $A_2$, $A_3$, $A_4$),
forming modulated light signals (LB1) by modulating the secondary pulses (LB0) propagating along the different optical branches ($A_1$, $A_2$, $A_3$, $A_4$),
delaying the modulated light signals (LB1) or delaying the secondary pulses (LB0) by different delay times ($\Delta t_{D1}$, $\Delta t_{D2}$, $\Delta t_{D3}$, $\Delta t_{D4}$), and
forming an optical signal (LB2) by combining the delayed modulated signals (LB1) from the different optical branches ($A_1$, $A_2$, $A_3$, $A_4$).

The primary pulses (LB00) may be e.g. laser pulses obtained from a laser light source. The optical pattern generator device OPG1 may comprise e.g. a laser source to provide laser pulses.

The optical pattern generator device OPG1 may comprise one or more distributors SPL1 to distribute the primary pulses (LB00) so as to form several secondary pulses (LB0). The one or more distributors SPL1 may form the secondary pulses (LB0) by distribute the light of the primary pulses (LB00) to the branches ($A_1$, $A_2$, $A_3$, $A_4$) of the generator device OPG1.

The optical pattern generator device OPG1 may comprise an array MAR1 of modulators MOD1, MOD2, MOD3, MOD4 to form modulated light signals (LB1) from the secondary pulses (LB0). The modulators may be e.g. Mach Zehnder modulators.

The optical pattern generator device OPG1 may comprise an array DAR1 of delay lines D1, D2, D3, D4 to provide different delay times ($\Delta t_{D1}$, $\Delta t_{D2}$, $\Delta t_{D3}$, $\Delta t_{D4}$) for the different branches ($A_1$, $A_2$, $A_3$, $A_4$) of the generator device OPG1. The delay lines may be implemented e.g. by waveguides of different lengths.

The optical pattern generator device OPG1 may comprise one or more combiners CMB1 to combine the delayed modulated signals (LB1) from the different optical branches ($A_1$, $A_2$, $A_3$, $A_4$).

Each branch ($A_1$, $A_2$, $A_3$, $A_4$) may comprise an independently controllable modulator (MOD1, MOD1, MOD3, MOD4) and a delay line D1, D2, D3, D4.

An output OUT1 of the combiner CMB1 may provide an optical signal LB2, which comprises the desired arbitrary optical pulse pattern PAT1. The maximum pulse repetition rate of the optical pulse pattern PAT1 at the combiner output OUT1 may be equal to $M \cdot f_0$, where $f_0$ denotes the repetition rate of the primary pulses (LB00), and M denotes the number of the branches ($A_1$, $A_2$, $A_3$, $A_4$), which provide signals for said combiner CMB1. The number M of the branches may be e.g. in the range of 4 to 1024.

In an embodiment, the optical output signal LB2 may be coupled as the input signal CLB1 to the optical feedthrough OFEED1 of the cryogenic chamber VES1.

The optical pattern generator device OPG1 may optionally comprise one or more optical amplifiers (AMP3) to amplify the optical power of the optical pulses. In an embodiment, an optical signal obtained from the output (OUT3) of an optical amplifier (AMP3) may be coupled as the input signal CLB1 to the optical feedthrough OFEED1 of the cryogenic chamber VES1.

The delay lines (D1, D2, D3, D4) may also be positioned between the distributor SPL1 and the modulators (MOD1, MOD1, MOD3, MOD4).

In an embodiment, the timing of the primary pulses (LB00) may be synchronized with a clock CLK1, e.g. by using a synchronization signal $S_{SYNC}$.

In an embodiment, the timing of the primary pulses (LB00) may even be traceable to the time of an atomic clock (CLK1).

The state of each modulator may be set to a pass state or to a blocking state. In the blocking state the modulator may prevent propagation of an optical pulse. In the pass state the modulator may allow propagation of an optical pulse. Consequently, the modulator may provide an existing optical pulse in the pass state. The modulator may provide a missing optical pulse in the blocking state.

The optical pattern generator device OPG1 may comprise a control unit PG0 to control the states of the modulators. The optical pattern generator device OPG1 may comprise a memory MEM1 for storing a primary pattern PAT0. The control unit PG0 may comprise one or more data processors PROC1 to provide control signals $b_1$, $b_2$, $b_3$, $b_4$ for changing the states of the modulators according to the primary pattern PAT0 and according to the timing signal $S_{SYNC}$. The optical pattern generator device OPG1 may optionally comprise a driving unit DRV1 to amplify the control signals $b_1$, $b_2$, $b_3$, $b_4$, if needed. For example, a driving unit DRV1 may provide high voltage driving signals S1, S2, S3, S4 for the modulators based on the control signals $b_1$, $b_2$, $b_3$, $b_4$, if needed.

Each modulator may be modulated with a frequency, which is smaller than or equal to the repetition rate of the primary optical pulses LB00.

The maximum modulation frequency of each modulator (MOD1, MOD1, MOD3, MOD4) may be equal to the repetition rate $f_0$ of the primary pulses (LB00). The repetition rate $f_0$ of the primary pulses (LB00) may be e.g. smaller than 10 GHz, or even smaller than 1 GHz. Even when generating an arbitrary waveform, it is not necessary to change the state of an individual modulator at a rate which is higher than $f_0$. Consequently, the maximum pulse repetition rate of the optical pulse pattern PAT1 may be higher than the maximum modulation rate of each individual modulator.

Figure 5A:
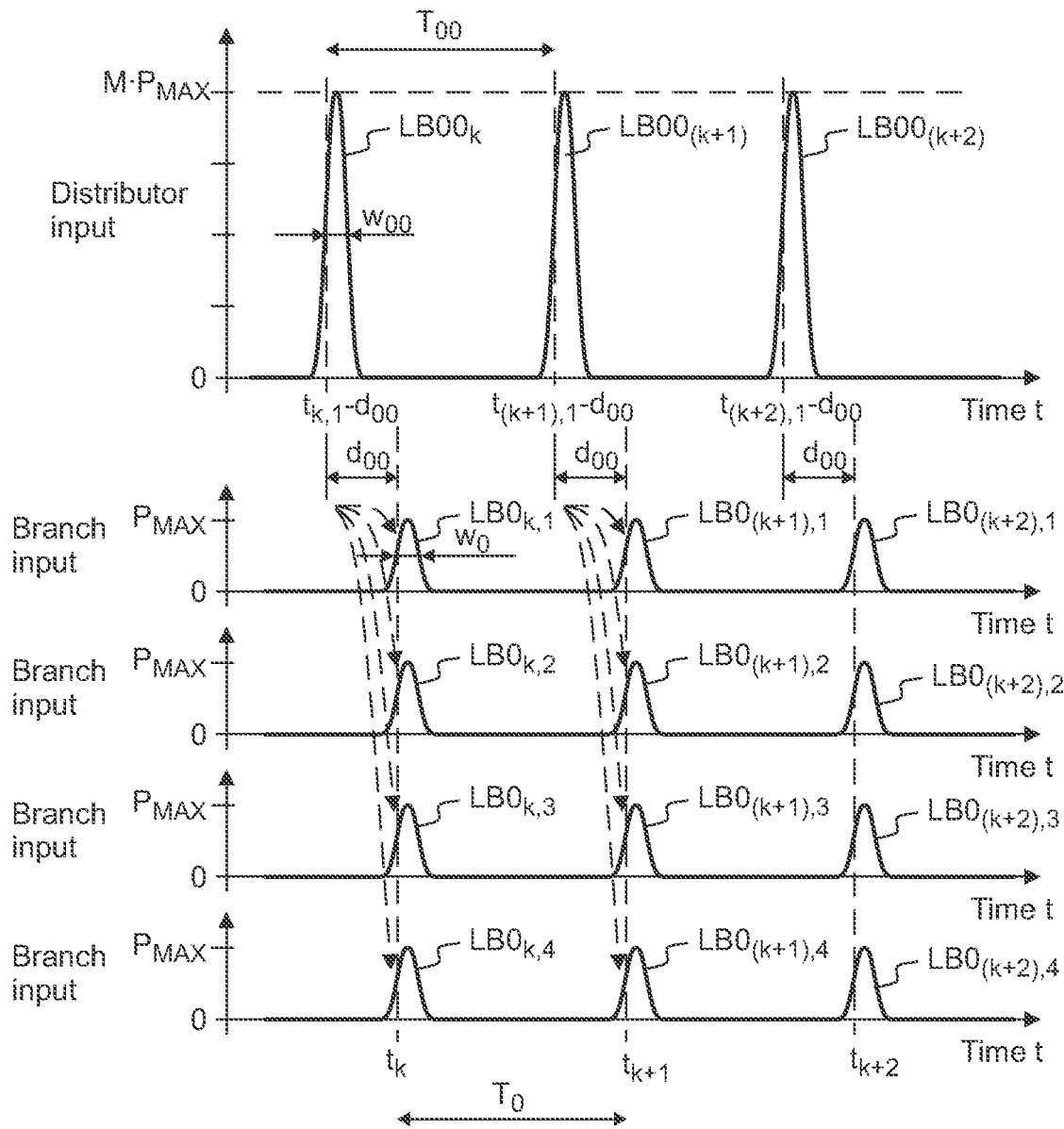
FIG. 5a shows, by way of example, forming optical pulses, which propagate along the arms of the optical pattern generator device.

Referring to FIG. 5a, a light source LS1 of the optical pattern generator device OPG1 may provide a sequence of primary light pulses LB00 at a repetition rate $f_0$ (=1/$T_{00}$). A distributor (SPL1) may form several secondary pulses LB0 from a single primary light pulse LB00, and the distributor (SPL1) may guide the secondary pulses LB0 to propagate along different branches (A1, A2, A3, A4) of the optical pattern generator device OPG1. The repetition rate of the secondary pulses of an individual branch may be equal to the repetition rate ($f_0$) of the primary light pulses LB00.

$T_{00}$ may denote the time period between consecutive primary pulses LB00$_k$, LB00$_{k+1}$. The pulse repetition frequency $f_0$ of the primary pulses LB00 may be equal to 1/$T_{00}$. $w_{00}$ may denote temporal width of the primary pulses LB00. $T_0$ may denote the time period between consecutive secondary pulses LB0$_k$, LB0$_{k+1}$. The pulse repetition frequency $f_0$ of the secondary pulses LB0 may be equal to 1/$T_0$. The pulse repetition frequency of the secondary pulses LB0 may be equal to the pulse repetition frequency $f_0$ of the primary pulses LB00. $w_0$ may denote temporal width of the secondary pulses LB0. The symbol P may denote optical power of a pulse. $d_{00}$ may denote a propagation delay. The primary pulses LB00 may be distributed to the branches of the optical pattern generator device OPG1 so as to form the secondary pulses LB0.

Figure 5B:
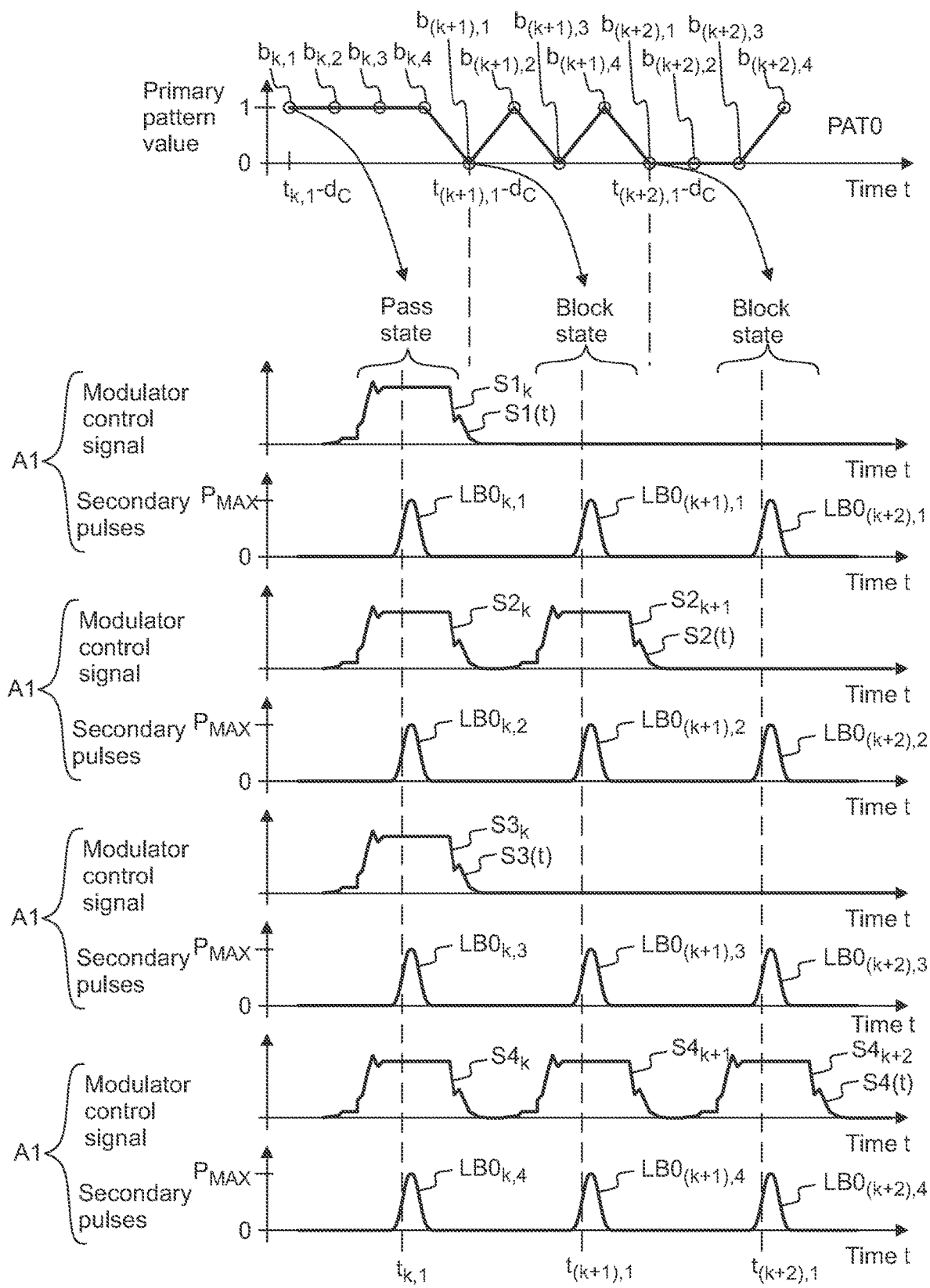
FIG. 5b shows, by way of example, modulating the power of the optical pulses, which propagate along the arms of the optical pattern generator device.
Figure 5C:
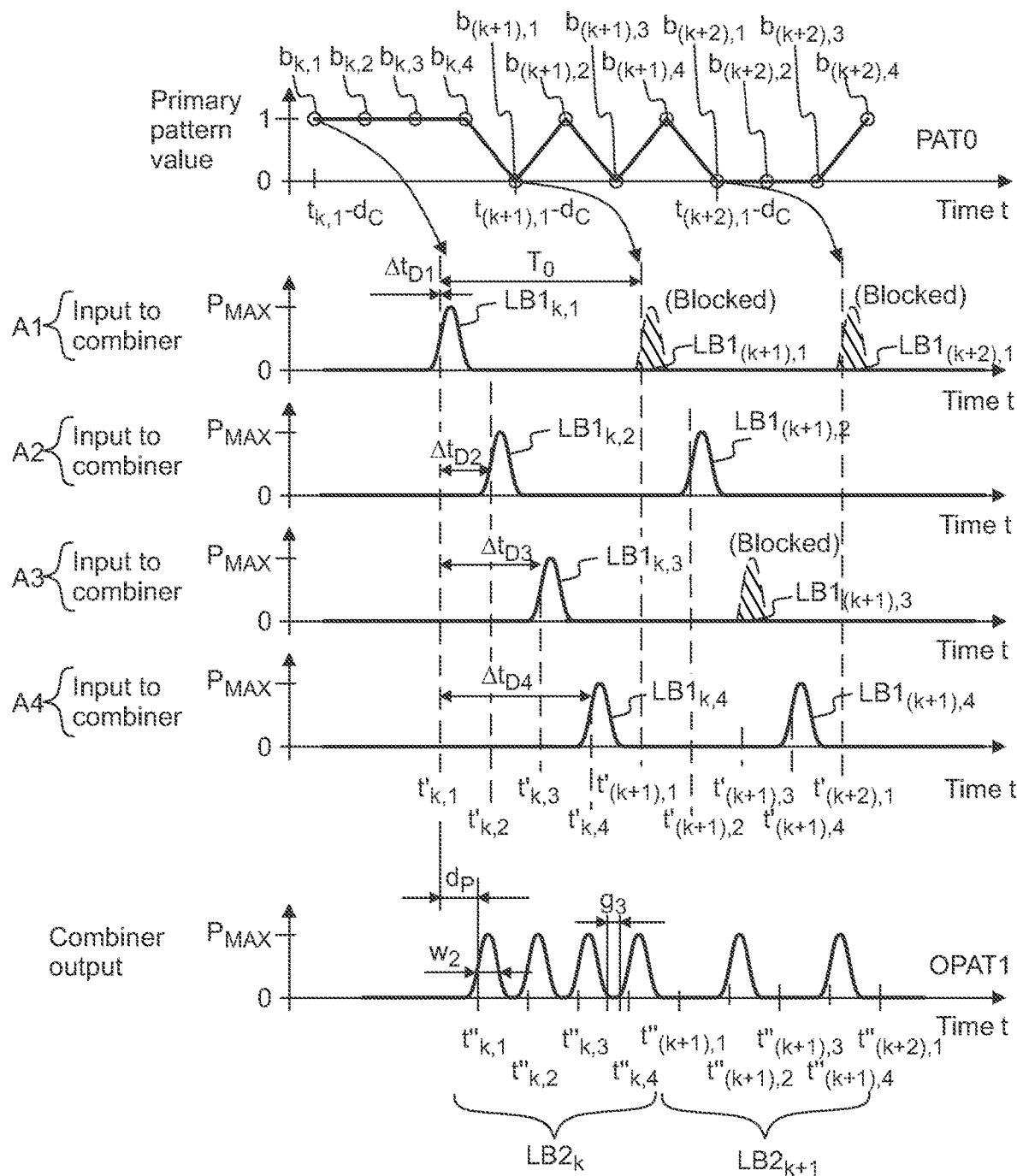
FIG. 5c shows, by way of example, forming an optical pulse pattern by combining the modulated pulses from the arms of the optical pattern generator device.

Referring to FIGS. 5b and 5c, the modulator (MOD) of each branch (A) may form a modulated optical signal from the secondary pulses LB0 arriving at the modulator (MOD), by allowing a pulse to pass or by blocking the pulse. The state of each modulators may be controlled according to a primary pattern PAT0. The primary pattern PAT0 may be read e.g. from a memory MEM1. The primary pattern PAT0 may be read e.g. from a computer-readable memory MEM1 of the control unit PG0 of the optical pattern generator device OPG1. The primary pattern PAT0 may be defined e.g. by a sequence of values $b_{k,1}$, $b_{k,2}$, $b_{k,3}$, $b_{k,4}$, $b_{k+1,1}$, $b_{k+1,2}$, $b_{k+1,3}$, $b_{k+1,4}$. Control signals S1, S2, S3, S4 may be formed according to the values $b_{k,1}$, $b_{k,2}$, $b_{k,3}$, $b_{k,4}$, $b_{k+1,1}$, $b_{k+1,2}$, $b_{k+1,3}$, $b_{k+1,4}$ of the primary pattern PAT0, and the state of each modulator may be set to the pass state or to the blocking state according to the control signals S1, S2, S3, S4. $d_c$ may denote an advance time between reading a value of the primary pattern PAT0 and arrival time of an optical pulse to a modulator.

In an embodiment, the primary pattern PAT0 may also be obtained e.g. from a data communication pathway. In an embodiment, the primary pattern PAT0 may be determined according to data obtained from a data communication pathway.

Referring to FIG. 5c, the secondary pulses LB0 or the modulated signals propagating along each branch of the optical pattern generator device OPG1 may be delayed by different delay times $\Delta t_{D1}$, $\Delta t_{D2}$, $\Delta t_{D3}$, $\Delta t_{D4}$. The delayed optical signals obtained from the different branches may be combined to form an optical pulse pattern PAT1. The maximum repetition rate of the pulses of the pulse pattern PAT1 may be equal to M·$f_0$, where M denotes the number of the branches combined at the output, and $f_0$ denotes the repetition rate of the primary pulses LB00. $d_p$ may denote a propagation delay. $w_2$ may denote the width of optical pulses of the optical pulse pattern. $g_3$ may denote a time period between consecutive pulses of an optical pulse pattern.

Figure 6:
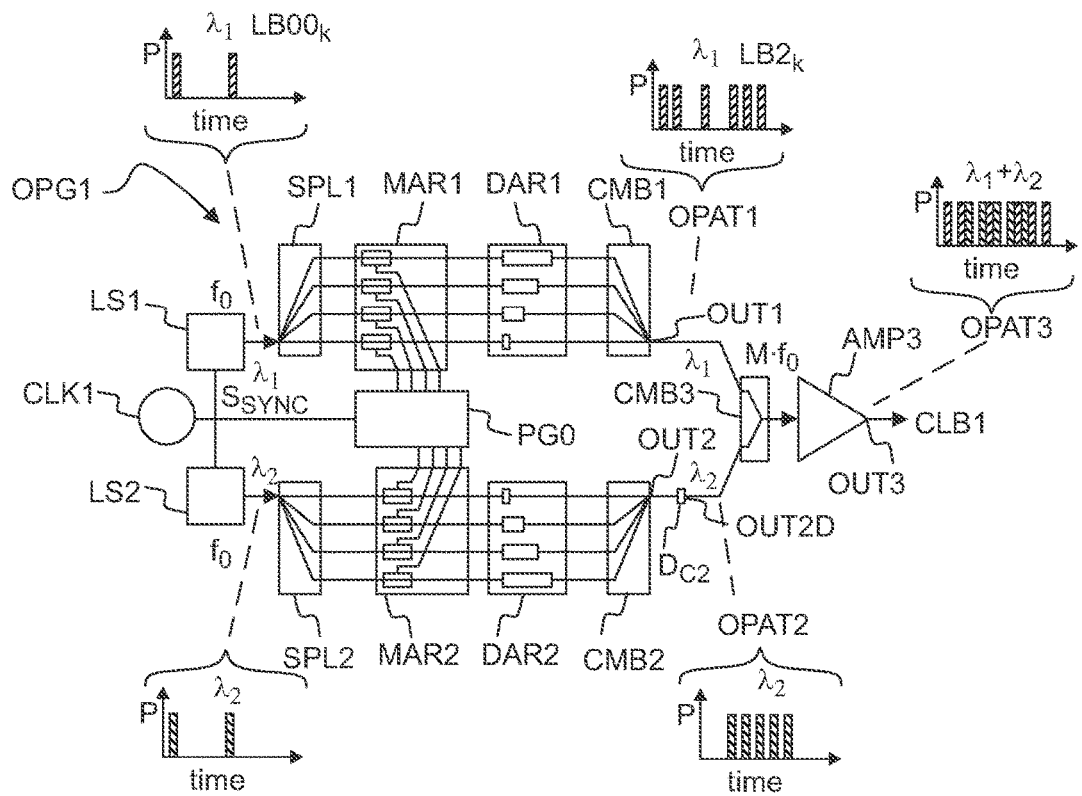
FIG. 6 shows, by way of example, an optical pattern generator device, which provides optical pulses at two different wavelengths.

Referring to FIG. 6, the optical pattern generator device OPG1 may be arranged to provide a first optical pulse pattern PAT1 at a first wavelength $\lambda_1$, and a second optical pulse pattern PAT2 at a second wavelength $\lambda_2$. The second optical pulse pattern PAT2 may be synchronized and/or interlaced with the first optical pulse pattern PAT1.

The generator device OPG1 may comprise a first light source LS1 to provide primary light pulses LB00 at the first wavelength $\lambda_1$, and a second light source LS2 to provide primary light pulses LB00 at the second wavelength $\lambda_2$. The operation of the second light source LS1 may be synchronized with the operation of the first light source LS1 by using a synchronization signal $S_{SYNC}$.

A first distributor SPL1 may form secondary light pulses LB0 from the primary pulses LB00 of the first light source LS1, and may guide the secondary light pulses LB0 to propagate along a first group of branches. The secondary pulses propagating along each branch of the first group may be modulated, delayed, and combined to form the first optical pulse pattern PAT1.

A second distributor SPL2 may form secondary light pulses LB0 from the primary pulses LB00 of the second light source LS2, and may guide the secondary light pulses LB0 to propagate along a second group of branches. The secondary pulses propagating along each branch of the second group may be modulated, delayed, and combined to form the second optical pulse pattern PAT2. The optical pulse patterns PAT1, PAT2 may be combined to form a wavelength-multiplexed optical signal CLB1, which comprises the optical pulse patterns PAT1, PAT2. The optical pattern generator device OPG1 may optionally comprise one or more optical amplifiers to amplify the wavelength-multiplexed optical signal CLB1.

The second distributor SPL2 may form secondary light pulses LB0 from the primary pulses LB00 of the second light source LS2. The secondary pulses propagating along each branch of the second group may be modulated by a second array MAR2 of modulators. A second array DAR2 of delay lines may provide different delay times for the different branches. An output OUT2 of a second combiner CMB2 may provide an optical signal by combining optical pulses from the different branches. The generator device OPG1 may optionally comprise a delay line $D_{C2}$ for delaying the second pulse pattern PAT2 with respect to the first pulse pattern PAT1. The delay line $D_{C2}$ may have an output OUT2D to provide a delayed pulse pattern.

Distributing optical pulses into several branches of the optical pattern generator device OPG1, and combining modulated delayed signals from the different branches of the optical pattern generator device OPG1 may provide highly accurate stable optical pulses at high repetition rate. Furthermore, the repetition rate of the optical pulses may be highly accurate.

In an embodiment, the optical pattern generator device OPG1 may also be implemented e.g. by obtaining an electrical signal from an electrical arbitrary waveform generator, and by converting the electrical signal into a sequence of optical pulses e.g. by modulating the output of a laser. For example, the output of a laser diode may be modulated according to an electrical signal produced by an electrical arbitrary waveform generator. In that case the properties of the optical pulses may be limited by the properties of the electrical signal from the electrical arbitrary waveform generator.

Figure 7A:
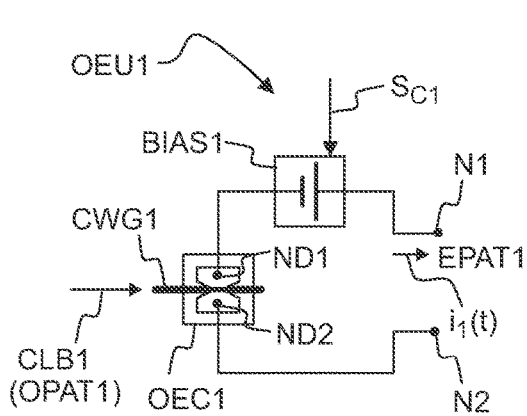
FIG. 7a shows, by way of example, an optical-to-electrical converter unit, which comprises a bias unit and a plasmonic photodetector.
Figure 7B:
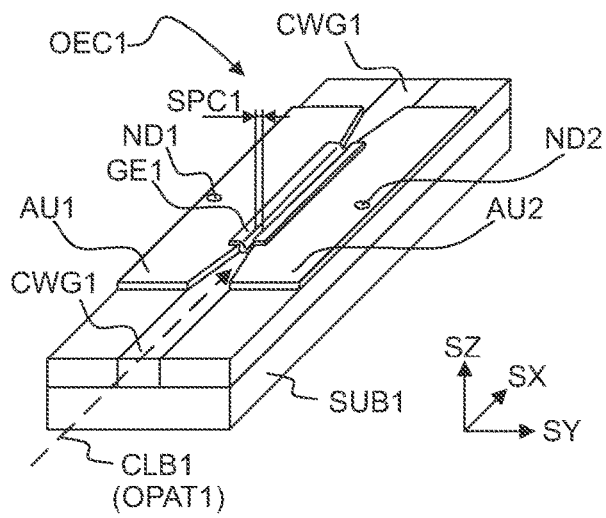
FIG. 7b shows, by way of example, a plasmonic photodetector implemented on a waveguide.

Referring to FIG. 7a, each optical-to-electrical converter unit OEU1 may comprise one or more optical-to-electrical converters OEC1. The optical-to-electrical converter OEC1 may be e.g. a plasmonic photodetector.

The optical-to-electrical converter unit OEU1 may comprise a bias unit BIAS1 to provide a bias voltage for the optical-to-electrical converter OEC1. The bias unit BIAS1 may provide a bias voltage for a plasmonic photodetector. The bias unit BIAS1 may be connected in series with connection nodes ND1, ND2 of the optical-to-electrical converter OEC1.

An optical pulse may temporarily increase conductivity between the nodes ND1, ND2 so that the converter unit OEU1 may generate a driving current pulse $i_1(t)$. The optical-to-electrical converter unit OEU1 may convert a sequence of optical pulses OPAT1 into a sequence of driving current pulses EPAT1.

Each optical-to-electrical converter OEC1, OEC2 may be optionally implemented on an optical waveguide CWG1, CWG2. the optical waveguides (CWG1, CWG2) may be e.g. silicon waveguides.

FIG. 7b shows, by way of example, a plasmonic photodetector OEC1 implemented on an optical waveguide CWG1. The plasmonic photodetector OEC1 may comprise metallic structures AU1, AU2 to define a plasmonic gap SPC1. The plasmonic gap SPC1 may be at least partly filled with semiconducting material GE1, e.g. germanium. Light of an optical signal CLB1 may be coupled from the waveguide CWG1 to the plasmonic gap SPC1 by evanescent coupling, so as to effectively interact with the semiconducting material GE1. The metallic structures AU1, AU2 may comprise or consist of e.g. gold. The metallic structures AU1, AU2 may be arranged to operate as output nodes ND1, ND2 of the plasmonic photodetector OEC1. The waveguide CWG1 may be implemented on a substrate SUB1. The waveguide CWG1 may be e.g. silicon waveguide implemented on a substrate SUB1.

A plasmonic photodetector (OEC1) may comprise one or more metallic structures to confine light by coupling an electromagnetic wave to charged carrier oscillations at a surface of the metal. The wavelength of the oscillations may be smaller than the corresponding wavelength in vacuum. The resulting interaction between light and matter in the subwavelength scale may allow providing a compact high-speed photodetector.

A plasmonic photodetector or a superconducting nanowire single-photon detector (SNSPD) may allow changing the polarity of the output current pulses, e.g. by changing the polarity of a bias supply.

Figure 8:
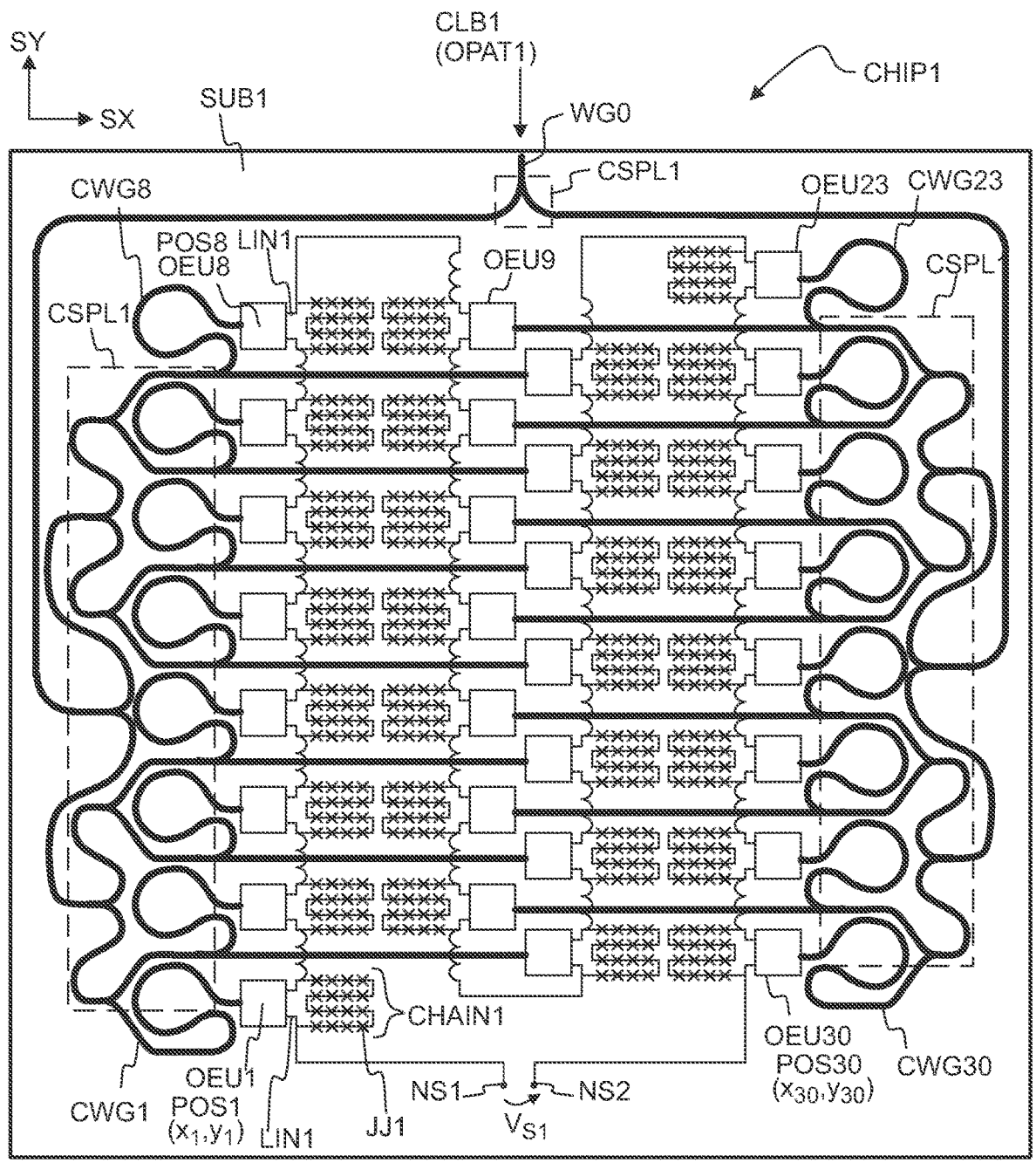
FIG. 8 shows, by way of example, a plurality of converter units implemented on the same substrate.

Referring to FIG. 8, a plurality of waveguides CWG1, CWG2, . . . CWG30 and a plurality of converter units OEU1, OEU2, . . . OEU30 may be implemented on the same substrate SUB1. The apparatus 1000 may comprise an integrated module CHIP1, which comprises a plurality of optical-to-electrical converters and a plurality of waveguides for distributing one or more optical pulse patterns to the optical-to-electrical converters. One or more optical pulse patterns OPAT1 of the optical signal CLB1, may be distributed via one or more optical distributors CSPL1 and via the plurality of waveguides CWG1 to the converter units OEU1, OEU2. The optical distribution of the one or more optical pulse patterns OPAT1 may allow selecting the spatial positions POS1 of the converter units OEU1, OEU2 such that the length of the electric transmission lines LIN1 may be reduced or minimized. Consequently, distributing the optical pulse patterns OPAT1 via the several waveguides may allow high repetition rate for the driving current pulses and/or may reduce losses.

The position of each converter unit may be specified e.g. by coordinates (x,y). SX, SY and SZ may denote orthogonal directions. For example, the position POS1 of a converter unit OEU1 may be specified by coordinates $(x_1, y_1)$. For example, the position POS30 of a converter unit OEU30 may be specified by coordinates $(x_{30}, y_{30})$.

A plurality of Josephson junctions may be connected in series to form a chain CHAIN1. An optical-to-electrical converter may be arranged to provide driving current pulses for a chain CHAIN1 of Josephson junctions JJ1. The number of Josephson junctions JJ1 of a chain CHAIN1 may be e.g. in the range of 4 to 128. One or more converters of the apparatus may also be arranged to drive less than 4 Josephson junctions JJ1.

A plurality of chains (CHAIN1) of Josephson junctions (JJ1) may be connected in series to form a combined voltage signal ($V_{S1}(t)$). Each chain (CHAIN1) may comprise at least four Josephson junctions (JJ1) connected in series. All Josephson junctions (JJ1) of each contributing chain (CHAIN1) may be driven by electric driving current pulses (EPAT1) obtained from an optical-to-electrical converter unit (OEC1) connected to said chain (CHAIN1). The maximum length of each contributing chain (CHAIN1) may be e.g. shorter than 100 µm.

The length of the chain may mean the electrical path length from the first Josephson junction (JJ1) to the last Josephson junction (JJ1) of said chain. The contributing chains may be chains which contribute to the combined voltage signal ($V_{S1}(t)$).

Figure 9:
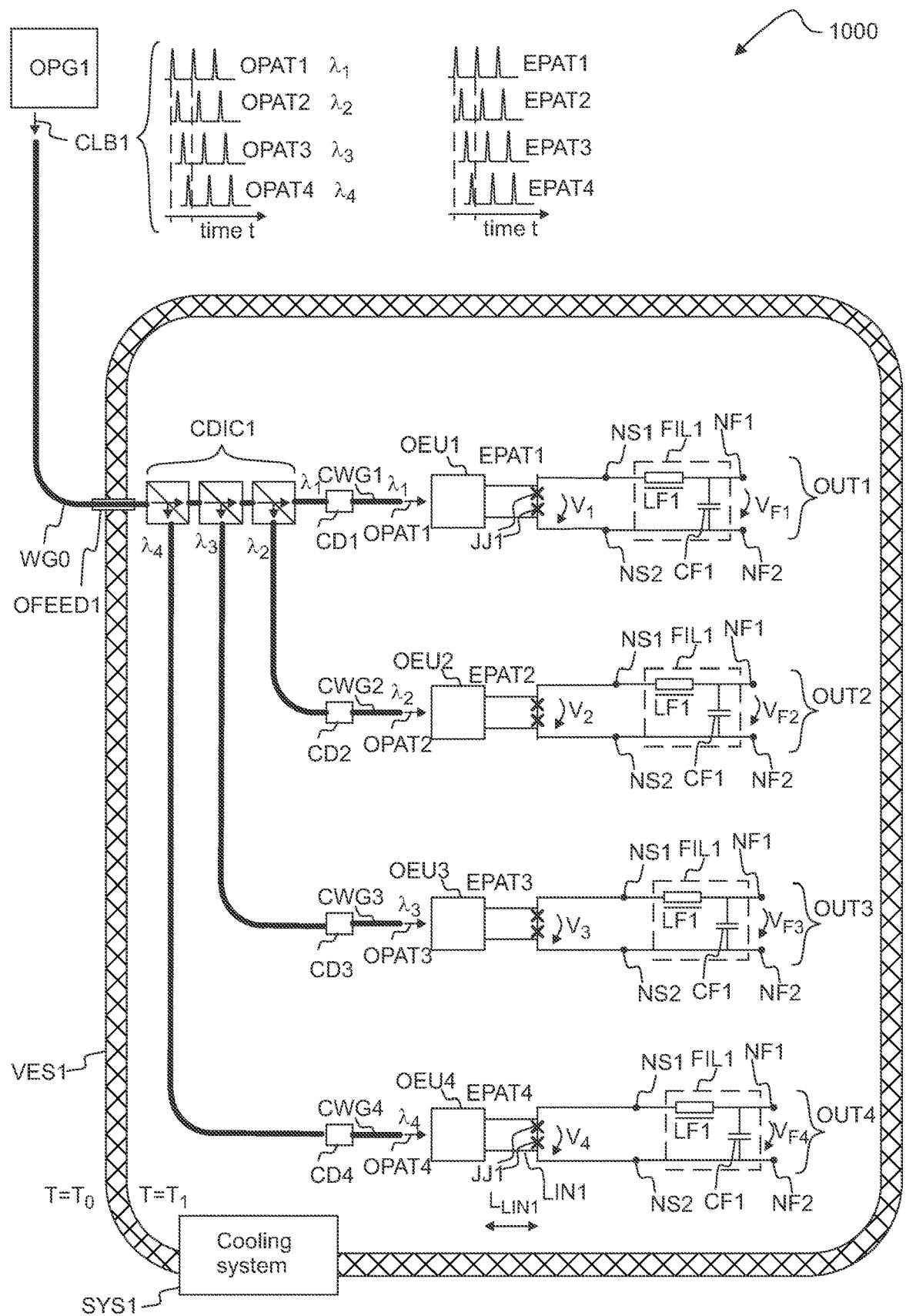
FIG. 9 shows, by way of example, an optical pattern generator device, which comprises several independently controlled outputs.

Referring to FIG. 9, the generator device OPG1 may comprise several optical-to-electrical converter units OEU1, OEU2, OEU3, OEU4, Josephson junctions JJ1, and several filters FIL1 which may be arranged to provide several independently controllable output signals $V_{F1}$, $V_{F2}$, $V_{F3}$ $V_{F4}$. A first output voltage signal $V_{F1}$ may be formed by converting a first optical pulse OPAT1 into electrical driving current pulses EPAT1. A second output voltage signal $V_{F2}$ may be formed by converting a second optical pulse OPAT1 into electrical driving current pulses EPAT2. First voltage pulses $V_1(t)$ may be generated by driving Josephson junctions (JJ1) with the electric driving current pulses (EPAT1). Second voltage pulses $V_2(t)$ may be generated by driving Josephson junctions (JJ1) with the electric driving current pulses (EPAT2). A first filtered signal $V_{F1}$ may be formed by filtering the first voltage pulses $V_1(t)$ with a first filter (FIL1). A second filtered signal $V_{F2}$ may be formed by filtering the second voltage pulses $V_2(t)$ with a second filter (FIL1). The generator device OPG1 may comprise several outputs OUT1, OUT2, OUT3, OUT4 for providing several different output signals. The generator device OPG1 may be arranged to provide a first output signal $V_{F1}$ from a first output OUT1. The generator device OPG1 may be arranged to provide a second output signal $V_{F2}$ from a second output OUT2.

The method may comprise forming a first output signal ($V_{F1}$) from voltage pulses ($V_1(t)$) generated by one or more first Josephson junctions (JJ1), and forming a second different output signal ($V_{F2}$) from voltage pulses ($V_1(t)$) generated by one or more second Josephson junctions (JJ1).

In an embodiment, the Josephson junctions (JJ1) and the optical-to-electrical converters (OEC1, OEC2) have been implemented on a first substrate, and wherein the optical waveguides (CWG1, CWG2) have been implemented on a second different substrate.

Various aspects are illustrated by the following examples.

Example 1. A method for generating a voltage waveform ($V_{S1}(t)$, $V_{F1}(t)$), the method comprising:
- providing an optical signal (CLB1), which comprises one or more sequences of optical pulses (OPAT1, OPAT2),
- distributing the optical pulses (OPAT1) via optical waveguides (CWG1, CWG2) to a plurality of optical-to-electrical converter units (OEU1, OEU2),
- using the optical-to-electrical converter units (OEU1, OEU2) to convert the optical pulses (OPAT1, OPAT2) into electric driving current pulses (EPAT1),
- generating voltage pulses ($V_1(t)$, $V_2(t)$) by driving Josephson junctions (JJ1) with the electric driving current pulses (EPAT1).

Example 2. The method of example 1, comprising forming a combined voltage signal ($V_{S1}(t)$) by combining voltage pulses ($V_1(t)$, $V_2(t)$) of several Josephson junctions (JJ1).

Example 3. The method of example 1, comprising forming a first output signal ($V_{F1}$) from voltage pulses ($V_1(t)$) generated by one or more first Josephson junctions (JJ1), and forming a second different output signal ($V_{F2}$) from voltage pulses ($V_2(t)$) generated by one or more second Josephson junctions (JJ1).

Example 4. The method according to any of examples 1 to 3, wherein a plurality of chains (CHAIN1) of Josephson junctions (JJ1) have been connected in series to form the combined voltage signal ($V_{S1}(t)$), wherein each chain (CHAIN1) comprises at least four Josephson junctions (JJ1) connected in series, wherein all Josephson junctions (JJ1) of each contributing chain (CHAIN1) are driven by electric driving current pulses (EPAT1) obtained from an optical-to-electrical converter unit (OEU1) connected to said chain (CHAIN1), wherein the maximum length of each contributing chain (CHAIN1) is shorter than 100 µm, and wherein the contributing chains are chains which contribute to the combined voltage signal ($V_{S1}(t)$).

Example 5. The method according to any of examples 1 to 4, wherein the spatial locations of the optical-to-electrical converter units (OEU1, OEU2) have been selected such that a maximum distance (Lim) for transferring electric driving current pulses (EPAT1) from each optical-to-electrical converter unit (OEU1, OEU2) to a Josephson junction (JJ1) is smaller than 3 mm.

Example 6. The method according to any of examples 1 to 5, wherein the electric driving current pulses (EPAT1) are transmitted from the optical-to-electrical converter units (OEU1, OEU2) to the Josephson junctions (JJ1) via electrical transmission lines (LIN1), wherein the lengths (Lim) of the electrical transmission lines (LIN1) are substantially equal such that the deviation of the length of each electrical transmission line (LIN1) from a nominal length ($L_0$) is smaller than 3 mm.

Example 7. The method according to any of examples 1 to 6, comprising forming a filtered voltage waveform ($V_{F1}(t)$) by filtering the combined voltage signal ($V_{S1}(t)$) with a low pass filter (FIL1).

Example 8. The method according to any of examples 1 to 7, wherein each optical-to-electrical converter unit (OEU1, OEU2) comprises one or more optical-to-electrical converters (OEC1, OEC2), and wherein the optical waveguides (CWG1, CWG2) and the optical-to-electrical converters (OEC1, OEC2) have been implemented on the same substrate (SUB1).

Example 9. The method according to any of examples 1 to 8, wherein each optical-to-electrical converter unit (OEU1, OEU2) comprises one or more optical-to-electrical converters (OEC1, OEC2), and wherein each optical-to-electrical converter (OEC1, OEC2) has been implemented on an optical waveguide (CWG1, CWG2).

Example 10. The method according to any of examples 1 to 9, wherein the optical waveguides (CWG1, CWG2) are silicon waveguides.

Example 11. The method according to any of examples 1 to 7, wherein each optical-to-electrical converter unit (OEU1, OEU2) comprises one or more optical-to-electrical converters (OEC1, OEC2), the Josephson junctions (JJ1) and the optical-to-electrical converters (OEC1, OEC2) have been implemented on a first substrate, and wherein the optical waveguides (CWG1, CWG2) have been implemented on a second different substrate.

Example 12. The method according to any of examples 1 to 11, wherein each optical-to-electrical converter unit (OEU1, OEU2) comprises one or more optical-to-electrical converters (OEC1, OEC2), and wherein the optical-to-electrical converters (OEC1, OEC2) are plasmonic photodetectors.

Example 13. The method according to any of examples 1 to 11, wherein each optical-to-electrical converter unit (OEU1, OEU2) comprises one or more optical-to-electrical converters (OEC1, OEC2), and wherein the optical-to-electrical converters (OEC1, OEC2) are uni-traveling-carrier photodiodes (UTC-PD).

Example 14. The method according to any of examples 1 to 11, wherein each optical-to-electrical converter unit (OEU1, OEU2) comprises one or more optical-to-electrical converters (OEC1, OEC2), and wherein the optical-to-electrical converters (OEC1, OEC2) are superconducting nanowire detectors arranged to detect single and/or multiple photons.

Example 15. The method according to any of examples 1 to 14, wherein the Josephson junctions (JJ1) are partitioned into two or more groups, a first group comprises first Josephson junctions (JJ1) connected in series, a second group comprises second Josephson junctions (JJ1) connected in series, the number of Josephson junctions (JJ1) of the first group is different from the number of Josephson junctions (JJ1) of the second group, and wherein the method comprises enabling and disabling operation of the Josephson junctions (JJ1) of the first group in a situation where operation of the Josephson junctions (JJ1) of the second group are enabled.

Example 16. The method according to any of examples 1 to 15, wherein the optical signal (CLB1) which comprises a first sequence of optical pulses (OPAT1) at a first wavelength ($\lambda_1$), and a second sequence of optical pulses (OPAT2) at a second different wavelength ($\lambda_2$), wherein the method comprises spectrally separating the first sequence of optical pulses (OPAT1) from the optical signal (CLB1) and guiding the separated first sequence of optical pulses (OPAT1) to one or more first optical-to-electrical converter units (OEU1), wherein the method comprises guiding the second sequence of optical pulses (OPAT2) to one or more second optical-to-electrical converter units (OEU2).

Example 17. The method according to any of examples 1 to 16, comprising forming the optical signal (CLB1) by a method, which comprises:
- distributing a primary pulse (LB00) to form several secondary pulses (LB0),
- guiding the secondary pulses (LB0) to propagate along different optical branches ($A_1$, $A_2$) of an optical pulse generator (OPG1),
- forming modulated light signals (LB1) by modulating the secondary pulses (LB0) propagating along the different optical branches ($A_1$, $A_2$), delaying the modulated light signals (LB1) or delaying the secondary pulses (LB0) by different delay times ($\Delta t_{D1}$, $\Delta t_{D2}$), and forming an optical signal (LB2) by combining the delayed modulated signals (LB1) from the different optical branches ($A_1$, $A_2$).

Example 18. The method according to any of examples 1 to 17, comprising the distributing optical pulse sequences (OPAT1,OPAT2) to the plurality of optical-to-electrical converters (OEU1, OEU2) by using one or more optical distributors (CSPL1) and silicon photonic optical transmission lines (CWG1, CWG2).

Example 19. The method according to any of examples 1 to 18, wherein the optical-to-electrical converter units (OEU1, OEU2) are integrated directly on waveguides (CWG1, CWG2).

Example 20. The method according to any of examples 1 to 19, wherein the optical pulse sequences (OPAT1,OPAT2) are distributed to a plurality of optical transmission lines (CWG1, CWG2) by one or more spectrally selective optical distributors (CDIC1) inside a cryogenic chamber (VES1).

Example 21. The method according to any of examples 1 to 20, wherein the optical signal (CLB1) comprises a plurality of optical pulse sequences (OPAT1,OPAT2) at different wavelengths ($\lambda_1$, $\lambda_2$), wherein the different pulse sequences (OPAT1,OPAT2) are demultiplexed from the optical signal (CLB1) into several different optical transmission lines (CWG1, CWG2) by one or more spectrally selective optical distributors (CDIC1).

Example 22. The method according to any of examples 1 to 21, wherein the pulse repetition rate of optical pulses of the optical signal (CLB1) is higher than 50 GHz.

Example 23. The method according to any of examples 1 to 22, comprising forming the optical signal (CLB1) by a method, which comprises:

providing primary pulses (LB00) at a repetition rate smaller than 10 GHz, distributing each primary pulse (LB00) to form several secondary pulses (LB0), guiding the secondary pulses (LB0) to propagate along different optical branches ($A_1$, $A_2$) of an optical pulse generator (OPG1), forming modulated light signals (LB1) by modulating the secondary pulses (LB0) propagating along the different optical branches ($A_1$, $A_2$), delaying the modulated light signals (LB1) or delaying the secondary pulses (LB0) by different delay times ($\Delta t_{D1}$, $\Delta t_{D2}$), and forming an optical signal (LB2) by combining the delayed modulated signals (LB1) from the different optical branches ($A_1$, $A_2$).

Example 24. The method according to any of examples 1 to 23, comprising generating a voltage waveform ($V_{S1}(t)$) from voltage pulses ($V_1(t),V_2(t)$) of the Josephson junctions (JJ1), and using the voltage waveform ($V_{F1}(t)$) as a voltage standard.

Example 25. An apparatus (1000) for generating a voltage waveform ($V_{S1}(t)$, $V_{F1}(t)$), the apparatus comprising:

an optical pulse generator (OPG1) to provide an optical signal (CLB1), which comprises a sequence of optical pulses (OPAT1), a plurality of optical-to-electrical converter units (OEU1, OEU2) to convert the optical pulses (OPAT1) into electrical driving current pulses (EPAT1), one or more optical distributors (CSPL1) and a plurality of optical waveguides (CWG1,CWG2) to distribute the optical pulses (OPAT1) to the different optical-to-electrical converter units (OEU1, OEU2), and a plurality of Josephson junctions (JJ1) to generate voltage pulses ($V_1(t),V_2(t)$) from the electric driving current pulses (EPAT1), the Josephson junctions (JJ1) being connected in series to form a combined voltage signal ($V_{S1}(t)$) from the voltage pulses ($V_1(t),V_2(t)$) of the Josephson junctions (JJ1).

For the person skilled in the art, it will be clear that modifications and variations of the devices and methods according to the present disclosure are perceivable. The figures are schematic. The particular embodiments described above with reference to the accompanying drawings are illustrative only and not meant to limit the scope of the disclosed embodiments, which is defined by the appended claims.

The invention claimed is:

1. A method for generating a voltage waveform, the method comprising:

providing an optical signal, which comprises one or more sequences of optical pulses, distributing the one or more sequences of optical pulses via optical waveguides to a plurality of optical-to-electrical converter units, wherein the one or more sequences of optical pulses are distributed to the optical waveguides by one or more spectrally selective optical distributors inside a cryogenic chamber, using the plurality of optical-to-electrical converter units to convert the one or more sequences of optical pulses into electric driving current pulses, and generating voltage pulses by driving Josephson junctions with the electric driving current pulses.

2. The method of claim 1, comprising forming a combined voltage signal by combining voltage pulses of several Josephson junctions.

3. The method of claim 1, comprising forming a first output signal from voltage pulses generated by one or more first Josephson junctions, and forming a second different output signal from voltage pulses generated by one or more second Josephson junctions.

4. The method according to claim 2, comprising forming a filtered voltage waveform by filtering the combined voltage signal with a low pass filter.

5. The method according to claim 1, wherein each of the plurality of optical-to-electrical converter units comprises one or more optical-to-electrical converters, and wherein the optical waveguides and the one or more optical-to-electrical converters are implemented on a same substrate.

6. The method according to claim 1, wherein each of the plurality of optical-to-electrical converter units comprises one or more optical-to-electrical converters, and wherein each of the one or more optical-to-electrical converters is implemented on an optical waveguide.

7. The method according to claim 1, wherein the optical waveguides are silicon waveguides.

8. The method according to claim 1, wherein each of the plurality of optical-to-electrical converter units comprises one or more optical-to-electrical converters, the Josephson junctions and the one or more optical-to-electrical converters being implemented on a first substrate, and wherein the optical waveguides are implemented on a second different substrate.

9. The method according to claim 1, wherein each of the plurality of optical-to-electrical converter units comprises one or more optical-to-electrical converters, and wherein the one or more optical-to-electrical converters are uni-traveling-carrier photodiodes.

10. The method according to claim 1, wherein the optical signal comprises a first sequence of optical pulses at a first wavelength, and a second sequence of optical pulses at a second different wavelength, wherein the method further comprises spectrally separating the first sequence of optical pulses from the optical signal and guiding the separated first sequence of optical pulses to one or more first optical-to-electrical converter units, wherein the method further comprises guiding the second sequence of optical pulses to one or more second optical-to-electrical converter units.

11. The method according to claim 1, comprising forming the optical signal by a method, which comprises:
distributing a primary pulse to form several secondary pulses,
guiding the several secondary pulses to propagate along different optical branches of an optical pulse generator,
forming modulated light signals by modulating the several secondary pulses propagating along the different optical branches,
delaying the modulated light signals or delaying the several secondary pulses by different delay times, and
forming the optical signal by combining the delayed modulated signals from the different optical branches.

12. The method according to claim 1, comprising distributing the one or more sequences of optical pulses to the plurality of optical-to-electrical converters units by using the one or more spectrally selective optical distributors and silicon photonic optical transmission lines.

13. The method according to claim 1, wherein the plurality of optical-to-electrical converter units are integrated directly on waveguides.

14. The method according to claim 1, wherein the optical signal comprises a plurality of optical pulse sequences at different wavelengths, wherein the different pulse sequences are demultiplexed from the optical signal into several different optical transmission lines by the one or more spectrally selective optical distributors.

15. The method according to claim 1, wherein a pulse repetition rate of the one or more sequences of optical pulses of the optical signal is higher than 50 GHz.

16. The method according to claim 1, comprising forming the optical signal by a method, which comprises:
providing primary pulses at a repetition rate smaller than 10 GHZ,
distributing each primary pulse to form several secondary pulses,
guiding the several secondary pulses to propagate along different optical branches of an optical pulse generator,
forming modulated light signals by modulating the several secondary pulses propagating along the different optical branches,
delaying the modulated light signals or delaying the several secondary pulses by different delay times, and
forming the optical signal by combining the delayed modulated light signals from the different optical branches.

17. The method according to claim 1, comprising generating a voltage waveform from voltage pulses of the Josephson junctions.

18. A method for generating a voltage waveform, the method comprising:
providing an optical signal, which comprises one or more sequences of optical pulses,
distributing the one or more sequences of optical pulses via optical waveguides to a plurality of optical-to-electrical converter units,
using the plurality of optical-to-electrical converter units to convert the one or more sequences of optical pulses into electric driving current pulses,
generating voltage pulses by driving Josephson junctions with the electric driving current pulses, and
wherein a plurality of chains of Josephson junctions are connected in series to form a combined voltage signal, wherein each chain of the plurality of chains comprises at least four Josephson junctions connected in series, wherein all Josephson junctions of each contributing chain are driven by electric driving current pulses obtained from an optical-to-electrical converter unit connected to each contributing chain, wherein a maximum length of each contributing chain is shorter than 100 μm, and wherein each contributing chain is a chain that is configured to contribute to the combined voltage signal.

19. A method for generating a voltage waveform, the method comprising:
providing an optical signal, which comprises one or more sequences of optical pulses,
distributing the one or more sequences of optical pulses via optical waveguides to a plurality of optical-to-electrical converter units,
using the plurality of optical-to-electrical converter units to convert the one or more sequences of optical pulses into electric driving current pulses,
generating voltage pulses by driving Josephson junctions with the electric driving current pulses; wherein spatial locations of the plurality of optical-to-electrical converter units are selected such that a maximum distance for transferring electric driving current pulses from each of the plurality of optical-to-electrical converter units to a Josephson junction is smaller than 3 mm.

20. A method for generating a voltage waveform, the method comprising:
providing an optical signal, which comprises one or more sequences of optical pulses,
distributing the one or more sequences of optical pulses via optical waveguides to a plurality of optical-to-electrical converter units,
using the plurality of optical-to-electrical converter units to convert the one or more sequences of optical pulses into electric driving current pulses,
generating voltage pulses by driving Josephson junctions with the electric driving current pulses; wherein the electric driving current pulses are transmitted from the plurality of optical-to-electrical converter units to the Josephson junctions via electrical transmission lines, wherein lengths of each electrical transmission lines are substantially equal such that a deviation of a length of each electrical transmission line from a nominal length is smaller than 3 mm.

21. A method for generating a voltage waveform, the method comprising:
providing an optical signal, which comprises one or more sequences of optical pulses,
distributing the one or more sequences of optical pulses via optical waveguides to a plurality of optical-to-electrical converter units,
using the plurality of optical-to-electrical converter units to convert the one or more sequences of optical pulses into electric driving current pulses,
generating voltage pulses by driving Josephson junctions with the electric driving current pulses, wherein each of the plurality of optical-to-electrical converter units comprises one or more optical-to-electrical converters, and wherein the one or more optical-to-electrical converters are plasmonic photodetectors.

22. A method for generating a voltage waveform, the method comprising:
providing an optical signal, which comprises one or more sequences of optical pulses,
distributing the one or more sequences of optical pulses via optical waveguides to a plurality of optical-to-electrical converter units,
using the plurality of optical-to-electrical converter units to convert the one or more sequences of optical pulses into electric driving current pulses,
generating voltage pulses by driving Josephson junctions with the electric driving current pulses, wherein each of the plurality of optical-to-electrical converter units comprises one or more optical-to-electrical converters, and wherein the one or more optical-to-electrical converters are superconducting nanowire detectors configured to detect one or more of single or multiple photons.

23. A method for generating a voltage waveform, the method comprising:
providing an optical signal, which comprises one or more sequences of optical pulses,
distributing the one or more sequences of optical pulses via optical waveguides to a plurality of optical-to-electrical converter units,
using the plurality of optical-to-electrical converter units to convert the one or more sequences of optical pulses into electric driving current pulses,
generating voltage pulses by driving Josephson junctions with the electric driving current pulses, wherein the Josephson junctions are partitioned into two or more groups, wherein a first group comprises first Josephson junctions connected in series, a second group comprises second Josephson junctions connected in series, a number of Josephson junctions of the first group is different from a number of Josephson junctions of the second group, and wherein the method further comprises enabling and disabling operation of the Josephson junctions of the first group in a situation where operation of the Josephson junctions of the second group are enabled.

\* \* \* \* \*